(12) United States Patent
Meitl et al.

(10) Patent No.: US 9,704,821 B2
(45) Date of Patent: Jul. 11, 2017

(54) STAMP WITH STRUCTURED POSTS

(71) Applicant: X-Celeprint Limited, Cork (IE)

(72) Inventors: Matthew Meitl, Durham, NC (US); Christopher Bower, Raleigh, NC (US); Ronald S. Cok, Rochester, NY (US)

(73) Assignee: X-Celeprint Limited, Lee Maltings, Dyke Parade, Cork (IE)

( * ) Notice: Subject to any disclaimer, the term of this patent is extended or adjusted under 35 U.S.C. 154(b) by 0 days.

(21) Appl. No.: 14/918,174

(22) Filed: Oct. 20, 2015

(65) Prior Publication Data

US 2017/0047306 A1   Feb. 16, 2017

Related U.S. Application Data

(63) Continuation-in-part of application No. 14/823,917, filed on Aug. 11, 2015.

(51) Int. Cl.
| | |
|---|---|
| *H01L 23/00* | (2006.01) |
| *H01L 21/683* | (2006.01) |
| *B29C 59/02* | (2006.01) |
| B29L 31/34 | (2006.01) |
| B41F 16/00 | (2006.01) |

(52) U.S. Cl.
CPC .............. *H01L 24/81* (2013.01); *B29C 59/02* (2013.01); *H01L 21/6835* (2013.01); *H01L 24/75* (2013.01); *H01L 24/95* (2013.01); *B29C 2059/023* (2013.01); *B29C 2059/028* (2013.01); *B29L 2031/34* (2013.01); *B41F 16/00* (2013.01); *H01L 2224/81005* (2013.01); *H01L 2224/81345* (2013.01); *H01L 2224/81901* (2013.01); *H01L 2224/81986* (2013.01)

(58) Field of Classification Search
None
See application file for complete search history.

(56) References Cited

U.S. PATENT DOCUMENTS

| | | |
|---|---|---|
| 4,934,267 A | 6/1990 | Hashimoto et al. |
| 5,550,066 A | 8/1996 | Tang et al. |
| 5,621,555 A | 4/1997 | Park |
| 5,815,303 A | 9/1998 | Berlin |

(Continued)

FOREIGN PATENT DOCUMENTS

| | | |
|---|---|---|
| JP | H11-142878 A | 5/1999 |
| JP | 2005 099410 A | 4/2005 |

(Continued)

OTHER PUBLICATIONS

Cok, R. S. et al., AMOLED Displays Using Transfer-Printed Integrated Circuits, Society for Information Display, 10:902-904 (2010).
Roscher, H., VCSEL Arrays with Redundant Pixel Designs for 10Gbits/s 2-D Space-Parallel MMF Transmission, Annual Report, optoelectronics Department, (2005).
Yaniv et al., A 640×480 Pixel Computer Display Using Pin Diodes with Device Redundancy, 1988 International Display Research Conference, IEEE, CH-2678-1/88:152-154 (1988).

(Continued)

*Primary Examiner* — William Coleman
*Assistant Examiner* — Kien Ly
(74) *Attorney, Agent, or Firm* — Choate, Hall and Stewart LLP; William R. Haulbrook; Alexander D. Augst

(57) ABSTRACT

A stamp for micro-transfer printing includes a body and one or more posts extending from the body. At least one of the posts has a non-planar surface contour on the distal end of the post having a size, shape, or size and shape that accommodates a non-planar contact surface of a micro-transfer printable device.

20 Claims, 14 Drawing Sheets

(56) References Cited

U.S. PATENT DOCUMENTS

| | | | |
|---|---|---|---|
| 6,025,730 A | 2/2000 | Akram et al. | |
| 6,180,239 B1* | 1/2001 | Whitesides | B01L 3/5085 101/368 |
| 6,278,242 B1 | 8/2001 | Cok et al. | |
| 6,555,408 B1* | 4/2003 | Jacobsen | G02F 1/133305 257/E21.122 |
| 6,577,367 B2 | 6/2003 | Kim | |
| 6,717,560 B2 | 4/2004 | Cok et al. | |
| 6,756,576 B1 | 6/2004 | McElroy et al. | |
| 6,933,532 B2 | 8/2005 | Arnold et al. | |
| 6,969,624 B2 | 11/2005 | Iwafuchi et al. | |
| 6,974,711 B2 | 12/2005 | Yanagisawa et al. | |
| 6,998,644 B1* | 2/2006 | Boling | H01J 5/54 257/207 |
| 7,127,810 B2 | 10/2006 | Kasuga et al. | |
| 7,129,457 B2 | 10/2006 | McElroy et al. | |
| 7,195,733 B2 | 3/2007 | Rogers et al. | |
| 7,259,391 B2 | 8/2007 | Liu et al. | |
| 7,288,753 B2 | 10/2007 | Cok | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,622,367 B1 | 11/2009 | Nuzzo et al. | |
| 7,662,545 B2 | 2/2010 | Nuzzo et al. | |
| 7,691,656 B2 | 4/2010 | Bader et al. | |
| 7,704,684 B2 | 4/2010 | Rogers et al. | |
| 7,799,699 B2 | 9/2010 | Nuzzo et al. | |
| 7,816,856 B2 | 10/2010 | Cok et al. | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,110,425 B2 | 2/2012 | Yun | |
| 8,198,621 B2 | 6/2012 | Rogers et al. | |
| 8,207,547 B2 | 6/2012 | Lin | |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,449,285 B2* | 5/2013 | McGeehan | C12M 33/02 264/2.5 |
| 8,470,701 B2 | 6/2013 | Rogers et al. | |
| 8,502,192 B2 | 8/2013 | Kwak et al. | |
| 8,506,867 B2 | 8/2013 | Menard | |
| 8,664,699 B2 | 3/2014 | Nuzzo et al. | |
| 8,685,764 B2 | 4/2014 | Chu et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,854,294 B2 | 10/2014 | Sakariya | |
| 8,871,547 B2 | 10/2014 | Chu et al. | |
| 8,877,648 B2 | 11/2014 | Bower et al. | |
| 8,889,485 B2 | 11/2014 | Bower | |
| 8,895,406 B2 | 11/2014 | Rogers et al. | |
| 8,934,259 B2 | 1/2015 | Bower et al. | |
| 8,987,765 B2 | 3/2015 | Bibl et al. | |
| 9,238,309 B2* | 1/2016 | King | B29C 33/3857 |
| 9,307,652 B2 | 4/2016 | Bower | |
| 9,358,775 B2 | 6/2016 | Bower et al. | |
| 9,368,683 B1 | 6/2016 | Meitl et al. | |
| 9,401,344 B2 | 7/2016 | Bower et al. | |
| 9,550,353 B2 | 1/2017 | Bower et al. | |
| 9,555,644 B2 | 1/2017 | Rogers et al. | |
| 2002/0050220 A1 | 5/2002 | Schueller et al. | |
| 2003/0027083 A1 | 2/2003 | Fuller et al. | |
| 2004/0192041 A1 | 9/2004 | Jeong et al. | |
| 2005/0202595 A1 | 9/2005 | Yonehara et al. | |
| 2005/0285246 A1 | 12/2005 | Haba et al. | |
| 2006/0051900 A1 | 3/2006 | Shizuno | |
| 2007/0080464 A1 | 4/2007 | Goebel et al. | |
| 2008/0108171 A1 | 5/2008 | Rogers et al. | |
| 2008/0131822 A1 | 6/2008 | Liao et al. | |
| 2008/0164575 A1 | 7/2008 | Ikeda et al. | |
| 2008/0185705 A1 | 8/2008 | Osborn et al. | |
| 2008/0202365 A1 | 8/2008 | Schneider et al. | |
| 2009/0133914 A1* | 5/2009 | Dellmann | B81C 1/00373 174/260 |
| 2009/0199960 A1* | 8/2009 | Nuzzo | B82Y 10/00 156/230 |
| 2010/0062098 A1 | 3/2010 | Ando et al. | |
| 2010/0123134 A1 | 5/2010 | Nagata | |
| 2010/0123268 A1* | 5/2010 | Menard | H01L 21/6835 264/293 |
| 2010/0155989 A1 | 6/2010 | Ishii et al. | |
| 2010/0190293 A1 | 7/2010 | Maeda et al. | |
| 2010/0248484 A1 | 9/2010 | Bower et al. | |
| 2010/0265440 A1 | 10/2010 | French et al. | |
| 2010/0289115 A1 | 11/2010 | Akiyama et al. | |
| 2010/0308008 A1 | 12/2010 | Zhu et al. | |
| 2011/0182805 A1* | 7/2011 | DeSimone | A61K 9/0097 424/1.11 |
| 2011/0219973 A1 | 9/2011 | Gullentops et al. | |
| 2011/0266670 A1 | 11/2011 | England et al. | |
| 2012/0000379 A1 | 1/2012 | Greener et al. | |
| 2012/0043130 A1 | 2/2012 | Rathburn | |
| 2012/0104624 A1 | 5/2012 | Choi et al. | |
| 2012/0126229 A1* | 5/2012 | Bower | H01L 21/6835 257/48 |
| 2012/0168776 A1 | 7/2012 | Nakamura et al. | |
| 2012/0228669 A1 | 9/2012 | Bower et al. | |
| 2012/0256346 A1 | 10/2012 | Ogino et al. | |
| 2012/0313241 A1* | 12/2012 | Bower | H01L 21/563 257/737 |
| 2012/0314388 A1 | 12/2012 | Bower et al. | |
| 2012/0321738 A1 | 12/2012 | Ishii et al. | |
| 2012/0328728 A1 | 12/2012 | Nakatsuka et al. | |
| 2013/0068720 A1 | 3/2013 | Taniguchi | |
| 2013/0069275 A1* | 3/2013 | Menard | H01L 25/50 264/293 |
| 2013/0078576 A1 | 3/2013 | Wu et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0273695 A1 | 10/2013 | Menard et al. | |
| 2013/0333094 A1* | 12/2013 | Rogers | A41D 19/015 2/161.7 |
| 2013/0337608 A1 | 12/2013 | Kotani et al. | |
| 2014/0084450 A1 | 3/2014 | Nielson et al. | |
| 2014/0094878 A1 | 4/2014 | Gossler et al. | |
| 2014/0104243 A1 | 4/2014 | Sakariya et al. | |
| 2014/0159064 A1 | 6/2014 | Sakariya et al. | |
| 2014/0264763 A1 | 9/2014 | Meitl et al. | |
| 2014/0267683 A1 | 9/2014 | Bibl et al. | |
| 2014/0327132 A1 | 11/2014 | Zhang et al. | |
| 2014/0367633 A1 | 12/2014 | Bibl et al. | |
| 2015/0135525 A1 | 5/2015 | Bower | |
| 2015/0137153 A1 | 5/2015 | Bibl et al. | |
| 2015/0163906 A1* | 6/2015 | Bower | H01L 24/95 361/765 |
| 2015/0348926 A1 | 12/2015 | Bower | |
| 2015/0371874 A1 | 12/2015 | Bower et al. | |
| 2016/0016399 A1 | 1/2016 | Bower et al. | |
| 2016/0020120 A1 | 1/2016 | Bower et al. | |
| 2016/0020127 A1 | 1/2016 | Bower et al. | |
| 2016/0020130 A1 | 1/2016 | Bower et al. | |
| 2016/0020131 A1 | 1/2016 | Bower et al. | |
| 2016/0020187 A1 | 1/2016 | Okada et al. | |

(56) References Cited

U.S. PATENT DOCUMENTS

2017/0047303 A1    2/2017   Meitl et al.
2017/0048976 A1    2/2017   Prevatte et al.

FOREIGN PATENT DOCUMENTS

WO    WO-2008/103931 A2    8/2008
WO    WO-2016/012409 A2    1/2016

OTHER PUBLICATIONS

Kim, S. et al, Microstructural elastomeric surfaces with reversible adhesion and examples of their use in deterministic assembly by transfer printing, PNAS, 107(40):17095-17100 (2010).

Bower, C. A. et al., Transfer Printing: An Approach for Massively Parallel Assembly of Microscale Devices, IEE, Electronic Components and Technology Conference, 2008, pp. 1105-1109.

Foest, R. et al., Kalte Normaldruck-Jetplasmen zur lokalen Oberflächenbehandlung, Vakuum in Forschung and Praxis, 21(6):17-21, (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Hamer et al., 63.2: AMOLED Displays Using Transfer-Printed Integrated Circuits, SID 09 Digest, 947-950 (2009).

\* cited by examiner

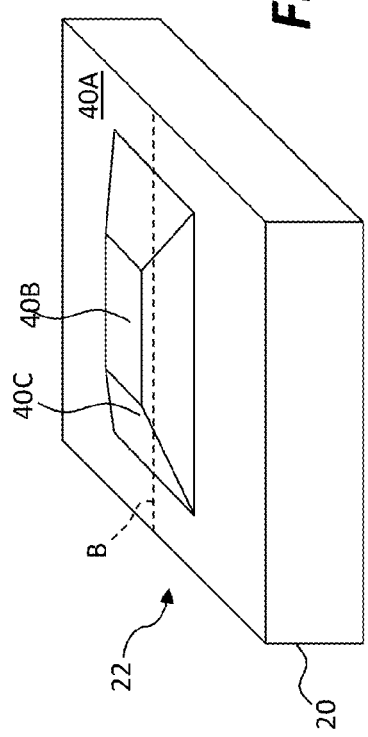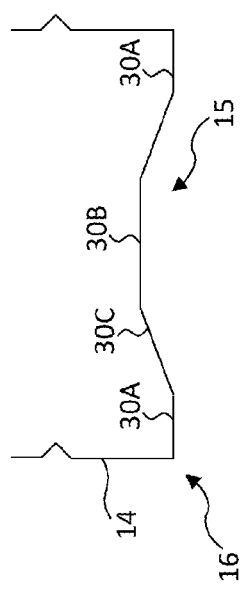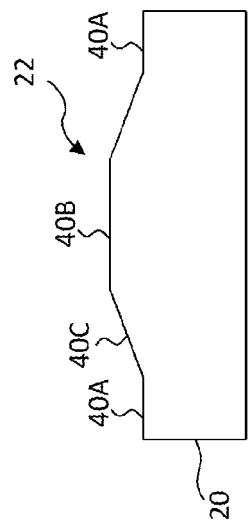

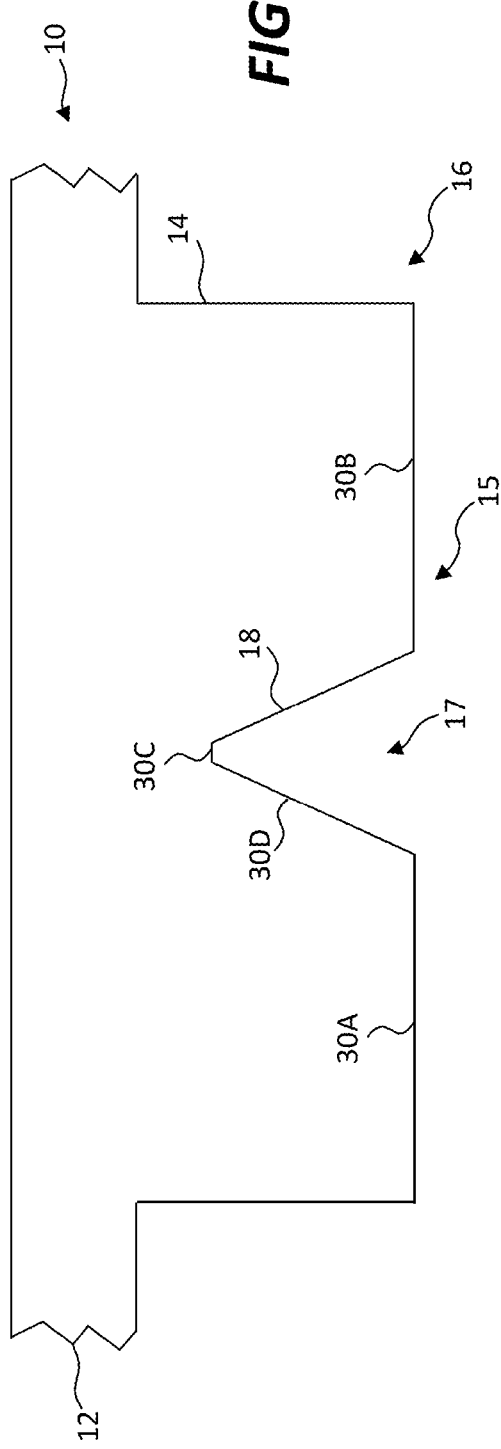
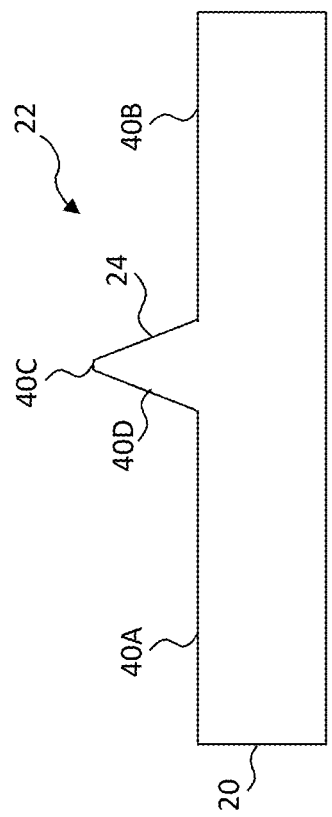

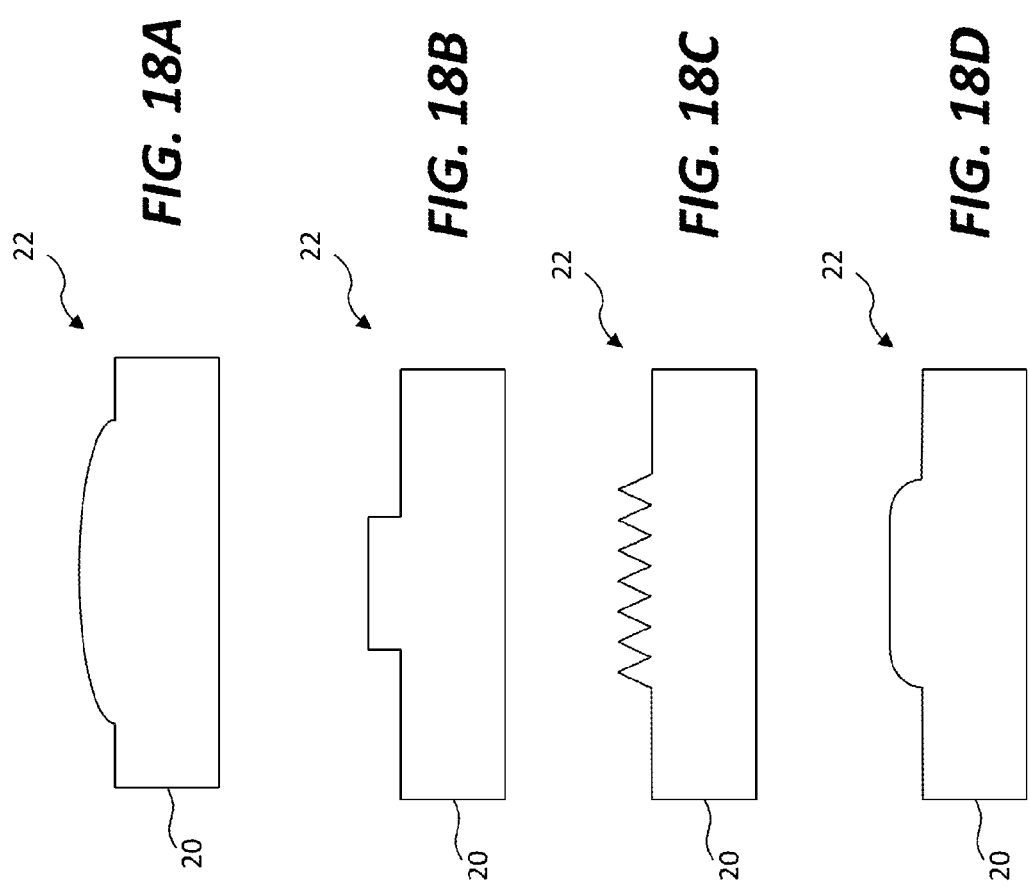

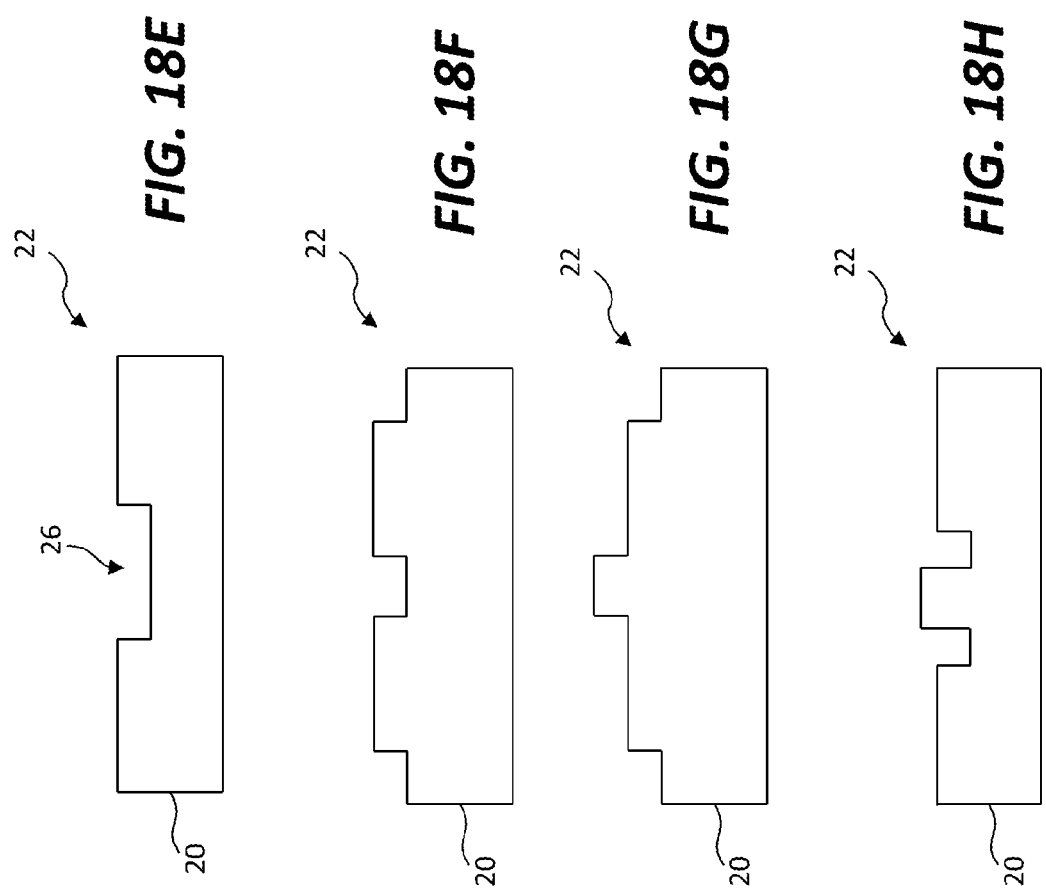

STAMP WITH STRUCTURED POSTS

RELATED APPLICATIONS

This application is a continuation-in-part of commonly assigned U.S. patent application Ser. No. 14/823,917 filed Aug. 11, 2015, entitled Printable Component Structure with Electrical Contact, which is hereby incorporated by reference in its entirety.

FIELD OF THE INVENTION

The present invention relates to stamps used in micro transfer printing.

BACKGROUND OF THE INVENTION

The disclosed technology relates generally to methods and tools for micro-transfer-printing. Conventional methods such as pick-and-place for applying integrated circuits to a destination substrate are limited to relatively large devices. For example, having a dimension of a millimeter or more and it is often difficult to pick up and place ultra-thin, fragile, or small devices using such conventional technologies. More recently, micro transfer printing methods have been developed that permit the selection and application of these ultra-thin, fragile, or small devices without causing damage to the devices themselves.

Micro-transfer-printing enables deterministically removing arrays of micro-scale, high-performance devices from a native source wafer, typically a semiconductor wafer on which the devices are constructed, and assembling and integrating the devices onto non-native destination substrates. In its simplest embodiment, micro-transfer-printing is analogous to using a rubber stamp to transfer liquid-based inks from an ink-pad onto paper. However, in micro-transfer-printing, the "inks" are composed of high-performance solid-state semiconductor devices and the "paper" can be substrates, including glass, plastics, or other semiconductors. The micro-transfer-printing process leverages engineered elastomer stamps coupled with high-precision motion-controlled print-heads to selectively pick-up and print large arrays of micro-scale devices from a source native wafer onto non-native destination substrates.

Adhesion between the elastomer transfer device and the printable element can be selectively tuned by varying the speed of the print-head. This rate-dependent adhesion is a consequence of the viscoelastic nature of the elastomer used to construct the transfer device. When the transfer device is moved quickly away from a bonded interface, the adhesion is large enough to "pick" the printable elements away from their native substrates, and conversely, when the transfer device is moved slowly away from a bonded interface the adhesion is low enough to "let go" or "print" the element onto a foreign surface. This process may be performed in massively parallel operations in which the stamps can transfer, for example, hundreds to thousands of discrete structures in a single pick-up and print operation.

Micro transfer printing enables parallel assembly of high-performance semiconductor devices onto virtually any substrate material, including glass, plastics, metals, or semiconductors. The substrates may be flexible, thereby permitting the production of flexible electronic devices. Flexible substrates may be integrated in a large number of configurations, including configurations not possible with brittle silicon-based electronic devices. Additionally, plastic substrates, for example, are mechanically rugged and may be used to provide electronic devices that are less susceptible to damage or electronic performance degradation caused by mechanical stress. Thus, these materials may be used to fabricate electronic devices by continuous, high-speed, printing techniques capable of generating electronic devices over large substrate areas at low cost (e.g., roll-to-roll manufacturing).

Moreover, micro transfer printing techniques can print semiconductor devices at temperatures compatible with assembly on plastic polymer substrates. In addition, semiconductor materials may be printed onto large areas of substrates thereby enabling continuous, high-speed printing of complex integrated electrical circuits over large substrate areas. Fully flexible electronic devices with good electronic performance in flexed or deformed device orientations can be provided to enable a wide range of flexible electronic devices.

Micro-structured stamps may be used to pick up micro devices from a source substrate, to transport the micro devices to the destination, and to print the micro devices onto a destination substrate. The transfer device (e.g., micro-structured stamp) can be created using various materials. Posts on the transfer device can be generated such that they pick up material from a pick-able object and then print the material to the target substrate. The posts can be generated in an array fashion and can have a range of heights depending on the size of the printable material. For effective, high-yield printing, when picking up the material it is important that stamp posts are in close contact with the material (e.g., micro integrated circuits) being transferred or printed. However, many integrated circuits do not have a planar surface whose area is readily contacted by a stamp post.

There is a need, therefore, for stamps having an improved ability to pick up and transfer material with a non-planar surface.

SUMMARY OF THE INVENTION

The present invention provides structures and methods that enable micro transfer printing for micro-devices that have a non-planar surface. The micro-devices are formed on a source substrate, contacted by a stamp to adhere the micro-devices to the stamp and release them from the source substrate, and pressed against a destination substrate to adhere the micro-devices to the destination substrate. The stamp is then moved away from the destination substrate, leaving the micro-devices on the destination substrate.

Such printed structures enable low-cost, high-performance arrays of electrically connected micro-devices (e.g., micro-LEDs) useful, for example, in display systems. For example, described herein are micro assembled arrays of micro devices, such as micro-LEDs, that are too small (e.g., micro-LEDs with a width, length, height, or diameter of 0.5 µm to 50 µm; e.g., a width of 1-8 µm, a length of 5-10 µm and a height of 0.5-3 µm), numerous, or fragile to be assembled by conventional means. Rather, these arrays are assembled using micro transfer printing technology. The micro-devices may be prepared on a native source substrate and printed to a destination substrate (e.g., plastic, metal, glass, sapphire, transparent materials, or flexible materials), thereby obviating the manufacture of the micro-devices on the destination substrate.

In certain embodiments, formation of the printable micro device begins while the semiconductor structure remains on a substrate, such as a sapphire substrate. After partially forming the printable micro device, a handle substrate is attached to the system opposite the substrate such that the system is secured to the handle substrate. The substrate, such as the sapphire substrate, may then be removed from the system using various techniques, such as laser ablation, grinding, etching, and polishing. After the substrate is removed, formation of the semiconductor structure is completed to form the printable micro device. Upon completion, the printable micro device may be micro transfer printed to a destination substrate, thereby enabling parallel assembly of high-performance semiconductor devices (e.g., to form micro-LED displays) onto virtually any substrate material, including glass, plastics, metals, other semiconductor materials, or other non-semiconductor materials.

Micro-structured stamps (e.g., elastomeric, electrostatic stamps, or hybrid elastomeric/electrostatic stamps) can be used to pick up the disclosed micro devices, transport the micro devices to the destination, and print the micro devices onto a destination substrate. In some embodiments, surface adhesion forces are used to control the selection and printing of these devices onto the destination substrate. This process may be performed massively in parallel. The stamps can be designed to transfer a single device or hundreds to thousands of discrete structures in a single pick-up and print operation. For a discussion of micro transfer printing generally, see U.S. Pat. Nos. 7,622,367 and 8,506,867, each of which is hereby incorporated by reference in its entirety.

Moreover, these micro transfer printing techniques can be used to print semiconductor devices at temperatures compatible with assembly on plastic polymer substrates. In addition, semiconductor materials may be printed onto large areas of substrates thereby enabling continuous, high speed printing of complex integrated electrical circuits over large substrate areas.

Furthermore, fully flexible electronic devices with good electronic performance in flexed or deformed device orientations can be provided to enable a wide range of flexible electronic devices. The destination substrate may be flexible, thereby permitting the production of flexible electronic devices. Flexible substrates may be integrated in a large number of configurations, including configurations not possible with brittle silicon based electronic devices. Additionally, plastic substrates, for example, are mechanically rugged and may be used to provide electronic devices that are less susceptible to damage and/or electronic performance degradation caused by mechanical stress. Thus, these materials may be used to fabricate electronic devices by continuous, high speed, printing techniques capable of generating electronic devices over large substrate areas at low cost (e.g., using roll-to-roll manufacturing).

Micro-devices, for example such as integrated circuits and micro-light-emitting diodes (micro-LEDs) constructed using photolithographic processes often have a topographically structured surface that is not flat, for example having contact pads, wires, and insulating layers, formed by repeated patterned etching steps that remove only a portion of the micro-device surface. A stamp used for micro transfer printing typically includes a body from which a post (sometimes called a pillar) extends. Each post is used to contact a single micro-device and each micro-device is contacted by a single post to perform a release and print of the micro-device from a source wafer to a destination wafer. A single post can have multiple separate portions that contact corresponding separate portions of the surface of a single micro-device but, as described herein, still constitutes a single post.

However, the distal end of a conventional post (i.e., the end of the post that is not attached to the body of the stamp) is typically a flat, planar surface orthogonal to the extension of the post. When applied to a micro-device that has a topographically structured surface and is therefore non-planar, the forces that adhere the micro-device to the distal end of the post are diminished because portions of the micro-device are not sufficiently close to the post. This reduction in contact adhesion can result in poor pick-up from the source wafer or loss of the micro-device during transport on the stamp post from the source wafer to the destination wafer. Although this problem is mitigated somewhat by the relatively soft and conformal post material, problems remain for micro-devices with substantially non-planar contact surfaces. A post 14 made of conformal material can be effective for micro-devices with a relatively smaller contact surface height variation but can fail for micro-devices with a relatively larger contact surface height variation. Similarly, a post 14 made of conformal material can be effective for micro-devices with a contact surface that is relatively planar but can fail for micro-devices with a contact surface that is relatively non-planar. Thus, the present invention enables micro-transfer printing of micro-devices having contact surfaces that have a greater contact surface height variation or are relatively non-planar.

According to an embodiment of the present invention, this problem is addressed with a stamp for micro-transfer printing that includes a body and one or more posts extending from the body, where at least one of the posts has a non-planar surface contour at the distal end of the post that has a size and shape that accommodates a non-planar contact surface of a micro-transfer printable device. By providing such a non-planar surface contour on the distal end of the post, the surface of the distal end of the post has a larger contact area with the micro-device than a planar surface thereby increasing the adhesion force between the surface of the distal end of the post and the non-planar contact surface of the micro-transfer printable device and improving the reliability of the micro-transfer printing process. The non-planar surface of the distal end of the post can substantially match, be geometrically similar to, or different from the non-planar contact surface of a micro-transfer printable device.

According to another embodiment of the present invention, a method of making a stamp with posts for micro-transfer printing includes providing a mold having a body portion and one or more post portions that extend away from the body portion, providing a device having a non-planar contact surface, filling the mold with curable stamp material and locating the non-planar contact surface of the device at the distal end of the post portion, and curing the curable stamp material to form a stamp for micro-transfer printing having a non-planar surface at the distal end of the post. The non-planar surface at the distal end of the post can be further processed to change the size or shape of any structures on the surface contour, for example to enhance the contact reliability.

In another embodiment of the present invention, the stamp for micro-transfer printing of the present invention is made by a process of the present invention and used for micro transfer printing by pressing the non-planar surface at the distal end of one of the one or more posts against the non-planar contact surface of the micro-transfer printable device to adhere the micro-transfer printable device to the distal end of the one post, removing the micro-transfer printable device from the wafer with the stamp, pressing the micro-transfer printable device to a destination substrate with the stamp to adhere the micro-transfer printable device to the destination substrate, and removing the stamp from the micro-transfer printable device and the destination substrate.

In certain embodiments of the present invention, the micro-transfer printable device is an integrated circuit or a light-emitting diode.

In certain embodiments of the present invention, the surface contour at the distal end of the post has a plurality of non-contiguous planar portions that accommodate non-contiguous planar portions of the printable device. Two or more of the plurality of planar portions can be parallel, in the same plane, or non-parallel and non-orthogonal.

In certain embodiments of the present invention, the planar portions of the stamp have an area smaller than the corresponding planar portions of the printable device.

In certain embodiments of the present invention, the surface contour is at least partly curved.

In certain embodiments of the present invention, the non-planar surface of the post includes a recess or cavity corresponding to a protruding portion of a micro-transfer printable device having a non-planar contact surface. The cavity can be larger than the protruding portion of the micro-transfer printable device or can have a shape that matches or is substantially similar to the protruding portion of the micro-transfer printable device.

In certain embodiments of the present invention, the one or more posts includes a first post having a first non-planar surface contour at the distal end of the first post and a second post having a second non-planar surface contour at the distal end of the first post different from the first non-planar surface contour. Thus, the different posts can have different surface contours that have different sizes or shapes, or both, that accommodate different non-planar contact surfaces of different micro-transfer printable devices.

In certain embodiments of the present invention, the micro-transfer printable device has a width from 1-8 μm, a length from 5-10 μm, or a height from 0.5-3 μm.

In one aspect, the disclosed technology includes a system for micro-transfer printing, including: an array of micro-transfer printable devices formed on or in a source substrate, each micro-transfer printable device having a non-planar contact surface; and a stamp for micro-transfer printing the micro-transfer printable devices from the source substrate to a destination substrate, the stamp comprising: a body; and an array of posts extending from the body, wherein each post in the array of posts has a non-planar surface contour on the distal end of the post having at least one of a size and shape that accommodates the non-planar contact surface of the micro-transfer printable device during micro-transfer printing.

In certain embodiments, an aspect ratio (height-to-width) of each post is from 1:4 to 4:1.

In certain embodiments, the non-planar contact surface of each micro-transfer printable device comprises a three-dimensional surface.

In certain embodiments, the non-planar contact surface of each micro-transfer printable device comprises one or more recesses.

In certain embodiments, the non-planar contact surface of each micro-transfer printable device comprises a structured surface with minimum height variation across the surface of at least 10 nm or a maximum height variation of 20 μm.

In certain embodiments, the non-planar contact surface of each micro-transfer printable device comprises a structured surface with a minimum height variation across the surface of at least 5 percent of the post height or a maximum height variation across the surface of less than or equal to 50 percent of the post height.

In certain embodiments, the non-planar surface contour at the distal end of each post has a plurality of non-contiguous planar portions that accommodate non-contiguous planar portions of the contact surface of a respective printable device.

In certain embodiments, two or more of the plurality of non-contiguous planar portions of each post are parallel.

In certain embodiments, two or more of the plurality of non-contiguous planar portions of each post are in the same plane.

In certain embodiments, two or more of the plurality of non-contiguous planar portions of each post are non-parallel and non-orthogonal.

In certain embodiments, the planar portions of each post have an area smaller than the corresponding planar portions of the contact surface of each printable device.

In certain embodiments, the non-planar surface contour is at least partly curved.

In certain embodiments, the non-planar surface of each post comprises a cavity; the non-planar contact surface of each micro-transfer printable device comprises a protruding portion; and each cavity corresponds to the protruding portion of a respective micro-transfer printable device having a non-planar contact surface during a transfer operation.

In certain embodiments, each cavity is larger than the protruding portion of a respective micro-transfer printable device.

In certain embodiments, each cavity has a different shape than the protruding portion of a respective micro-transfer printable device.

In certain embodiments, each cavity has a shape that is substantially similar to the protruding portion of a respective micro-transfer printable device.

In certain embodiments, the posts comprise a first post having a first non-planar surface contour at the distal end of the first post and a second post having a second non-planar surface contour at the distal end of the second post, wherein the second non-planar surface contour is different from the first non-planar surface contour.

In certain embodiments, the micro-transfer printable devices are integrated circuits.

In certain embodiments, the micro-transfer printable devices are light-emitting diodes.

In certain embodiments, the stamp is an elastomeric stamp.

In certain embodiments, the stamp is a conformable stamp.

In certain embodiments, the micro-transfer printable device has at least one of a width from 1-8 μm, a length from 5-10 μm, and a height from 0.5-3 μm.

In certain embodiments, only a portion of the non-planar surface contour of a respective post contacts a respective micro-transfer printable device during printing.

In certain embodiments, only a portion of a respective micro-transfer printable device contacts a respective portion of the non-planar surface contour of a respective post during printing.

In another aspect, the disclosed technology includes a method of making a stamp for micro-transfer printing, comprising: providing a mold having a body portion and one or more post portions that extend away from the body portion; providing a device having a non-planar contact surface; locating the non-planar contact surface of the device at the distal end of the post portion and filling the mold with curable stamp material; curing the curable stamp material to form a stamp for micro-transfer printing having a non-planar surface at the distal end of the post; and exposing the non-planar surface contour at the distal end of the post to a reactive or abrasive material to remove a portion of the non-planar surface.

In certain embodiments, the device is a micro-transfer printable device.

In certain embodiments, the micro-transfer printable devices are integrated circuits.

In certain embodiments, the micro-transfer printable devices are light-emitting diodes.

In certain embodiments, the method includes processing the non-planar surface at the distal end of the post to change the size or shape of the surface contour at the distal end of the post.

In certain embodiments, the stamp is an elastomeric stamp.

In certain embodiments, the stamp is a conformable stamp.

In certain embodiments, the body and the posts of the stamp comprise the same material.

In another aspect, the disclosed technology includes a method of using a micro-transfer printing stamp, the method including: providing an array of micro-transfer printable devices formed on or in a source substrate, each micro-transfer printable device having a non-planar contact surface; providing a stamp for micro-transfer printing the micro-transfer printable devices from the source substrate to a destination substrate, the stamp comprising: a body; and an array of posts extending from the body, wherein each post in the array of posts has a non-planar surface contour on the distal end of the post having at least one of a size and shape that accommodates the non-planar contact surface of the micro-transfer printable device during micro-transfer printing; pressing the non-planar surface at the distal end of one or more posts against the non-planar contact surface of the micro-transfer printable devices to adhere each micro-transfer printable device to the distal end of a respective post; removing the micro-transfer printable devices from the wafer with the stamp; pressing the micro-transfer printable devices to a destination substrate with the stamp to adhere the micro-transfer printable devices to the destination substrate; and removing the stamp from the micro-transfer printable devices, thereby transferring the micro-transfer printable devices to the destination substrate.

In certain embodiments, the method includes contacting the stamp to the source substrate, wherein each post of the stamp is displaced when placed in contact with a respective non-planar contact surface of the micro-transfer printable device on the source wafer; and removing the stamp from the source substrate to release the micro-transfer printable device from the source substrate.

In certain embodiments, the micro-transfer printable device has at least one of a width from 1-8 µm, a length from 5-10 µm, and a height from 0.5-3 µm.

In certain embodiments, an aspect ratio (height-to-width) of each post is from 1:4 to 4:1.

In certain embodiments, the non-planar contact surface of each micro-transfer printable device comprises a three-dimensional surface.

In certain embodiments, the non-planar contact surface of each micro-transfer printable device comprises one or more recesses.

In certain embodiments, the non-planar contact surface of each micro-transfer printable device comprises a structured surface with minimum height variation across the surface of at least 10 nm or a maximum height variation of 20 µm.

In certain embodiments, the non-planar contact surface of each micro-transfer printable device comprises a structured surface with a minimum height variation across the surface of at least 5 percent of the post height or a maximum height variation across the surface of less than or equal to 50 percent of the post height.

In certain embodiments, the non-planar surface contour at the distal end of each post has a plurality of non-contiguous planar portions that accommodate non-contiguous planar portions of the contact surface of a respective printable device.

In certain embodiments, two or more of the plurality of non-contiguous planar portions of each post are parallel.

In certain embodiments, two or more of the plurality of non-contiguous planar portions of each post are in the same plane.

In certain embodiments, two or more of the plurality of non-contiguous planar portions of each post are non-parallel and non-orthogonal.

In certain embodiments, the planar portions of each post have an area smaller than the corresponding planar portions of the contact surface of each printable device.

In certain embodiments, the non-planar surface contour is at least partly curved.

In certain embodiments, the non-planar surface of each post comprises a cavity; the non-planar contact surface of each micro-transfer printable device comprises a protruding portion; and each cavity corresponds to the protruding portion of a respective micro-transfer printable device having a non-planar contact surface during a transfer operation.

In certain embodiments, each cavity is larger than the protruding portion of a respective micro-transfer printable device.

In certain embodiments, each cavity has a different shape than the protruding portion of a respective micro-transfer printable device.

In certain embodiments, each cavity has a shape that is substantially similar to the protruding portion of a respective micro-transfer printable device.

In certain embodiments, the posts comprise a first post having a first non-planar surface contour at the distal end of the first post and a second post having a second non-planar surface contour at the distal end of the second post, wherein the second non-planar surface contour is different from the first non-planar surface contour.

In certain embodiments, the micro-transfer printable devices are integrated circuits.

In certain embodiments, the micro-transfer printable devices are light-emitting diodes.

In certain embodiments, the stamp is an elastomeric stamp.

In certain embodiments, the stamp is a conformable stamp.

In another aspect, the disclosed technology includes an array of micro-transfer printable devices (e.g., formed on or in a source substrate), each micro-transfer printable device having a first side with a contact surface and a second side, opposite the first side, with one or more protrusions thereon; and a stamp for micro-transfer printing the micro-transfer printable devices from the source substrate to a destination substrate, the stamp comprising: a body; an array of posts extending from the body; wherein each post in the array of posts has a non-planar surface contour on the distal end of the post such that discrete portions of the non-planar surface contour contact the contactsurface of a respective micro-transfer printable device during printing.

In certain embodiments, the contact surface is planar.

In certain embodiments, the contact surface is non-planar.

In certain embodiments, the non-planar surface contour of each post accommodates the non-planar surface of the micro-transfer printable device. In certain embodiments, the stamp provides non-uniform pressure over the contact surface.

In certain embodiments, the contacted portions of the contact surface are opposite the one or more protrusions.

In certain embodiments, only a portion of the non-planar surface contour of a respective post contacts a respective micro-transfer printable device during printing.

In certain embodiments, only a portion of a respective micro-transfer printable device contacts a respective portion of the non-planar surface contour of a respective post during printing.

In certain embodiments, an aspect ratio (height-to-width) of each post is from 1:4 to 4:1.

In certain embodiments, the non-planar contact surface of each micro-transfer printable device comprises a three-dimensional surface.

In certain embodiments, the non-planar contact surface of each micro-transfer printable device comprises one or more recesses.

In certain embodiments, the non-planar contact surface of each micro-transfer printable device comprises a structured surface with minimum height variation across the surface of at least 10 nm or a maximum height variation of 20 µm.

In certain embodiments, the non-planar contact surface of each micro-transfer printable device comprises a structured surface with a minimum height variation across the surface of at least 5 percent of the post height or a maximum height variation across the surface of less than or equal to 50 percent of the post height.

In certain embodiments, the non-planar surface contour at the distal end of each post has a plurality of non-contiguous planar portions that accommodate non-contiguous planar portions of the contact surface of a respective printable device.

In certain embodiments, two or more of the plurality of non-contiguous planar portions of each post are parallel.

In certain embodiments, two or more of the plurality of non-contiguous planar portions of each post are in the same plane.

In certain embodiments, two or more of the plurality of non-contiguous planar portions of each post are non-parallel and non-orthogonal.

In certain embodiments, the planar portions of each post have an area smaller than the corresponding planar portions of the contact surface of each printable device.

In certain embodiments, the non-planar surface contour is at least partly curved.

In certain embodiments, the non-planar surface of each post comprises a cavity; the non-planar contact surface of each micro-transfer printable device comprises a protruding portion; and each cavity corresponds to the protruding portion of a respective micro-transfer printable device having a non-planar contact surface during a transfer operation.

In certain embodiments, each cavity is larger than the protruding portion of a respective micro-transfer printable device.

In certain embodiments, each cavity has a different shape than the protruding portion of a respective micro-transfer printable device.

In certain embodiments, each cavity has a shape that is substantially similar to the protruding portion of a respective micro-transfer printable device.

In certain embodiments, the posts comprise a first post having a first non-planar surface contour at the distal end of the first post and a second post having a second non-planar surface contour at the distal end of the second post, wherein the second non-planar surface contour is different from the first non-planar surface contour.

In certain embodiments, the micro-transfer printable devices are integrated circuits.

In certain embodiments, the micro-transfer printable devices are light-emitting diodes.

In certain embodiments, the stamp is an elastomeric stamp.

In certain embodiments, the stamp is a conformable stamp.

In certain embodiments, the micro-transfer printable device has at least one of a width from 1-8 µm, a length from 5-10 µm, and a height from 0.5-3 µm.

In another aspect, the disclosed technology includes a method of using a micro-transfer printing stamp, the method including: providing an array of micro-transfer printable devices (e.g., formed on or in a source substrate), each micro-transfer printable device having a first side with a contact surface and a second side, opposite the first side, with one or more protrusions thereon; and providing a stamp for micro-transfer printing the micro-transfer printable devices from the source substrate to a destination substrate, the stamp comprising: a body; an array of posts extending from the body; wherein each post in the array of posts has a non-planar surface contour on the distal end of the post such that discrete portions of the non-planar surface contour contact the contact surface of a respective micro-transfer printable device during printing; pressing the distal end of one of the one or more posts against the contact surface of the micro-transfer printable device to adhere the micro-transfer printable device to the distal end of the one post; removing the micro-transfer printable device from the wafer with the stamp; pressing the micro-transfer printable device to a destination substrate with the stamp to adhere the micro-transfer printable device to the destination substrate; and removing the stamp from the micro-transfer printable device and the destination substrate.

In certain embodiments, the contact surface is planar.

In certain embodiments, the contact surface is non-planar.

In certain embodiments, the non-planar surface contour of each post accommodates the non-planar surface of the micro-transfer printable device.

In certain embodiments, the stamp provides non-uniform pressure over the contact surface.

In certain embodiments, the contacted portions of the contact surface are opposite the one or more protrusions.

In certain embodiments, only a portion of the non-planar surface contour of a respective post contacts a respective micro-transfer printable device during printing.

In certain embodiments, only a portion of a respective micro-transfer printable device contacts a respective portion of the non-planar surface contour of a respective post during printing.

In certain embodiments, an aspect ratio (height-to-width) of each post is from 1:4 to 4:1.

In certain embodiments, the non-planar contact surface of each micro-transfer printable device comprises a three-dimensional surface.

In certain embodiments, the non-planar contact surface of each micro-transfer printable device comprises one or more recesses.

In certain embodiments, the non-planar contact surface of each micro-transfer printable device comprises a structured surface with minimum height variation across the surface of at least 10 nm or a maximum height variation of 20 µm.

In certain embodiments, the non-planar contact surface of each micro-transfer printable device comprises a structured surface with a minimum height variation across the surface of at least 5 percent of the post height or a maximum height variation across the surface of less than or equal to 50 percent of the post height.

In certain embodiments, the non-planar surface contour at the distal end of each post has a plurality of non-contiguous planar portions that accommodate non-contiguous planar portions of the contact surface of a respective printable device.

In certain embodiments, two or more of the plurality of non-contiguous planar portions of each post are parallel.

In certain embodiments, two or more of the plurality of non-contiguous planar portions of each post are in the same plane.

In certain embodiments, two or more of the plurality of non-contiguous planar portions of each post are non-parallel and non-orthogonal.

In certain embodiments, the planar portions of each post have an area smaller than the corresponding planar portions of the contact surface of each printable device.

In certain embodiments, the non-planar surface contour is at least partly curved.

In certain embodiments, the non-planar surface of each post comprises a cavity; the non-planar contact surface of each micro-transfer printable device comprises a protruding portion; and each cavity corresponds to the protruding portion of a respective micro-transfer printable device having a non-planar contact surface during a transfer operation.

In certain embodiments, each cavity is larger than the protruding portion of a respective micro-transfer printable device.

In certain embodiments, each cavity has a different shape than the protruding portion of a respective micro-transfer printable device.

In certain embodiments, each cavity has a shape that is substantially similar to the protruding portion of a respective micro-transfer printable device.

In certain embodiments, the posts comprise a first post having a first non-planar surface contour at the distal end of the first post and a second post having a second non-planar surface contour at the distal end of the second post, wherein the second non-planar surface contour is different from the first non-planar surface contour.

In certain embodiments, the micro-transfer printable devices are integrated circuits.

In certain embodiments, the micro-transfer printable devices are light-emitting diodes.

In certain embodiments, the stamp is an elastomeric stamp.

In certain embodiments, the stamp is a conformable stamp.

In certain embodiments, the micro-transfer printable device has at least one of a width from 1-8 µm, a length from 5-10 µm, and a height from 0.5-3 µm.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 2 is a perspective of micro-transfer printable device with a non-planar contact surface corresponding to the stamp of FIG. 1 according to an embodiment of the present invention;

FIG. 3 is a cross section illustrating the surface contour on the distal end of the post of the micro-transfer printing stamp of FIG. 1 according to an embodiment of the present invention;

FIG. 4 is a cross section of the non-planar contact surface of the micro-transfer printable device of FIG. 2 according to an embodiment of the present invention;

FIG. 8 is a cross section illustrating the surface contour on the distal end of a post that accommodates the non-planar contact surface of the micro-transfer printable device of FIG. 9 according to an embodiment of the present invention;

FIG. 9 is a cross section of the non-planar contact surface of the micro-transfer printable device having a protrusion accommodated by the surface contour on the distal end of the post of FIG. 8 according to an embodiment of the present invention;

FIGS. 18A through 18H illustrate various examples of non-planar contact surfaces on micro-transfer printable devices.

Figure 1:
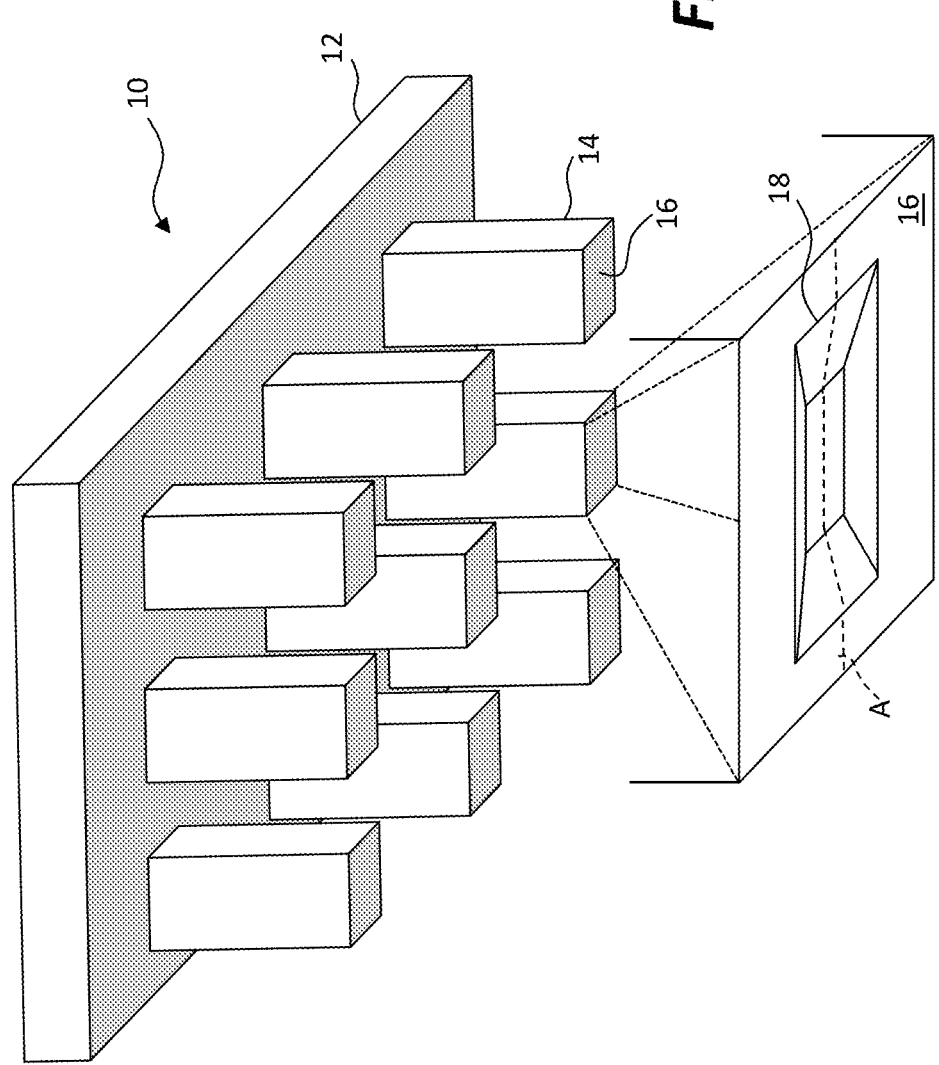
FIG. 1 is a perspective and detail of an embodiment of a micro-transfer printing stamp of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, or structurally similar elements. The figures are not drawn to scale since the variation in size of various elements in the Figures is too great to permit depiction to scale.

DETAILED DESCRIPTION OF THE INVENTION

The present invention provides a stamp structure and methods of making and using the stamp for micro transfer printing micro-transfer printable devices. The micro-transfer printable devices can be light emitters or integrated circuits, for example CMOS integrated circuits made on or in a silicon semiconductor wafer, light-emitting diodes (LEDs), for example made on or in a GaN semiconductor material, or silicon photodiodes. The micro-transfer printable devices can have a width from 1-8 µm, a length from 5-10 µm, or a height from 0.5-3 µm. More generally, the micro-transfer printable devices can include or be a variety of chiplets having conductor or semiconductor structures, including a diode, a light-emitting diode (LED), a transistor, a laser, active electrical components, passive electrical components, or an electrical jumper.

Chiplets are small integrated circuits that can be unpackaged dies released from a source wafer and can be micro-transfer printed. Chiplets can have at least one of a width, length, and height from 2 to 5 µm, 5 to 10 µm, 10 to 20 µm, or 20 to 50 µm. Chiplets can have a doped or undoped semiconductor substrate thickness of 2 to 5 µm, 5 to 10 µm, 10 to 20 µm, or 20 to 50 µm. The chiplet or micro-transfer printable devices can be micro-light-emitting diodes with a length greater than width, for example having an aspect ratio greater than or equal to 2, 4, 8, 10, 20, or 50 and component contact pads that are adjacent to the ends of the micro-transfer-printable devices along the length of the micro-transfer-printable devices.

Referring to FIG. 1, according to an embodiment of the present invention, system for micro-transfer printing includes a stamp 10 having a body 12, for example a stamp base. One or more posts 14 are supported by and extend from the body 12. The end of a post 14 that is attached or connected to the body 12 is the proximal end of the post 14 and the end of the post 14 that extends away from the body 12 is the distal end 16 of the post 14. The distal end 16 of the post 14 has a surface having a non-planar surface contour 15 (shown in FIG. 3) that has a size, shape, or size and shape that accommodates a non-planar contact surface of a micro-transfer printable device 20 (shown in FIG. 2). Thus, the surface of the distal end 16 of the post 14 has a structure and shape that is not flat.

Stamps 10 of the present invention can be made of conformal materials such as an elastomer, for example polydimethylsiloxane (PDMS).

As used herein, a planar surface contour or planar contact surface is a surface that is only a single plane. In contrast, a non-planar surface contour or non-planar contact surface is a surface that is not only a single plane. A non-planar surface contour or non-planar contact surface can include a surface that has multiple different planes, curves, protrusions, indentations, recesses, or different surfaces. The different planes can be parallel or non-parallel. A non-planar surface contour or non-planar contact surface can include a single plane with one or more structures 18 located within the single plane.

As used herein, each stamp post 14 contacts only one micro-transfer printable device 20 and each micro-transfer printable device 20 is contacted by only one stamp post 14. A non-planar surface contour 15 refers to the contour or surface of the entire stamp post 14 opposite the body. Thus, any portion of a stamp 10 that contacts a single micro-transferable printable device 20 is at least a part of a single post 14. The distal end of the stamp post 14 is taken to be all of the post surfaces opposite the stamp body 12. For example, the surfaces at the distal end of the stamp post 14 includes the surfaces 30A, 30B, and 30C of FIGS. 3, 6, 8, and 11 and the fourth planar portion 30D of the surface contour 15 in FIGS. 8 and 11 and the fifth, sixth, seventh, eighth, and ninth planar portions 30E, 30F, 30G, 30H, 30I of FIG. 11. A non-planar contact surface 22 refers to the entire surface of a single micro-transfer printable device 20.

Referring to the embodiment illustrated in the perspective of FIG. 2 and the cross section of FIG. 4 taken along the cross section line B of FIG. 2, a micro-transfer printable device 20 has a non-planar contact surface 22. In the particular embodiment of FIGS. 2 and 4, the non-planar contact surface 22 of the micro-transfer printable device 20 has a plurality of different planar portions 40B, 40C forming a truncated pyramid structure protruding from the plane 40A. The second planar portion 40B forms the truncated top of the pyramid, the third planar portions 40C form the sides, and the first planar portion 40A is the plane from which the pyramid protrudes. In this embodiment, two or more of the plurality of planar portions (first planar portion 40A and second planar portion 40B) are parallel. Also, in this embodiment, two or more of the plurality of planar portions (first planar portion 40A and second planar portions 40C) are non-parallel and non-orthogonal.

FIG. 3 is a cross section of the distal end 16 of the post 14 of the stamp 10 taken along the cross section line A of FIG. 1. Referring to the embodiment of FIG. 3, the non-planar surface contour 15 on the distal end 16 of the post 14 has a size, shape, or size and shape that accommodates the non-planar contact surface 22 of the micro-transfer printable device 20 of FIGS. 2 and 4. As shown in FIG. 3, the non-planar surface contour 15 includes first, second, and third planar portions 30A, 30B, and 30C. The first planar portion 30A corresponds to the first planar portion 40A of the micro-transfer printable device 20, the second planar portion 30B corresponds to the second planar portion 40B of the micro-transfer printable device 20, and the third planar portions 30C correspond to the third planar portions 40C of the micro-transfer printable device 20. (Only two third planar portions 30C are shown in the cross section of FIG. 3 and only two third planar portions 40C are shown in the cross section of FIG. 4.)

When micro-transfer printing the micro-transfer printable device 20 with the stamp 10 having a post 14 with the non-planar surface contour 15, the first portion 30A of the surface of the distal end 16 of the post 14 is brought into contact with the first portion 40A of the micro-transfer printable device 20, the second portion 30B of the surface of the distal end 16 of the post 14 is brought into contact with the second portion 40B of the micro-transfer printable device 20, and the third portions 30C of the surface of the distal end 16 of the post 14 are brought into contact with the third planar portions 40C of the micro-transfer printable device 20. In certain embodiments, the aggregate (total) area of the first, second, and third portions 30A, 30B, 30C together is larger than the contact area of a stamp with a planar post surface that would be in contact with the contact surface 22 of the micro-transferable printable device 20, for example only the area of the second portion 40B of the non-planar contact surface 22 of the micro-transfer printable device 20.

The non-planar surface contour 15 of the distal end 16 of the post 14 accommodates the non-planar contact surface 22 of a micro-transfer printable device 20 when the area of the non-planar surface of the distal end 16 of the post 14 in contact with the non-planar contact surface 22 of the micro-transfer printable device 20 is greater than the area of a planar surface of a distal end 16 of a post 14 that would be in contact with the non-planar contact surface 22 of the micro-transfer printable device 20 during micro transfer printing. Thus, according to embodiments of the present invention, a larger portion of the non-planar contact surface 22 of the micro-transfer printable device 20 is in contact with the non-planar surface of the distal end 16 of the post 14 than would be in contact with a planar surface of a distal end 16 of a post 14. The increased contact area results in a stronger adhesion between the surface of the distal end 16 of the post 14 and the contact area of the micro-transfer printable device 20. Note that the area of individual portions of the surface in contact with corresponding portions of the non-planar surface of the distal end 16 of the post 14 need not be larger than with a corresponding portion of a planar surface, but that the aggregate contact area is increased with the use of the non-planar surface of the distal end 16 of the post 14 according to embodiments of the present invention. For example, the area 30B of the surface contour 15 can be smaller than the area 40B of the non-contact surface 22 and the area 30A of the surface contour 15 can be smaller than the area 40A of the non-contact surface 22, as long as the sum of the areas 30A and 30B of the non-planar surface contour are greater than the area 40B contacted by a planar stamp post. Thus, according to an embodiment of the present invention, planar portions of the stamp 10 can have an area smaller than the corresponding planar portions of the micro-transfer printable device 20.

According to embodiments of the present invention, the surface contour 15 at the distal end 16 of the post 14 has a plurality of non-contiguous planar portions (e.g., first, and third planar portions 30A, 30C) that accommodate non-contiguous planar portions of the micro-transfer printable device 20 (e.g., first, and third planar portions 40A, 40C). Although not shown in FIG. 3, in some embodiments a plane of the surface contour 15 of the surface of the distal end 16 of the post 14 can include separate non-contiguous planar portions.

Figure 5:
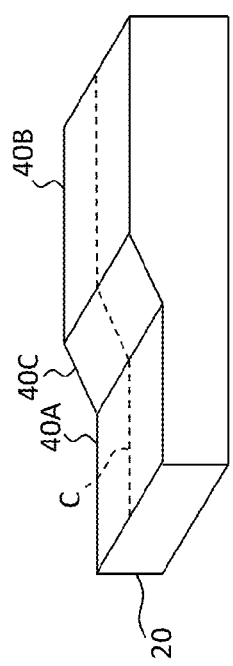
FIG. 5 is a perspective of another micro-transfer printable light-emitting diode device with a non-planar contact surface according to an embodiment of the present invention.
Figure 6:
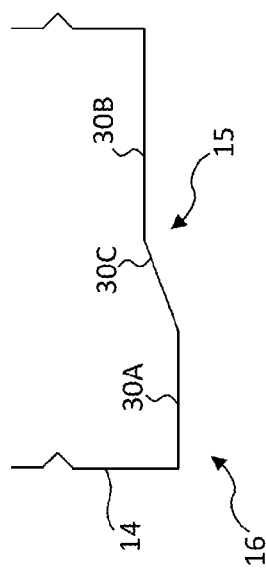
FIG. 6 is a cross section illustrating the surface contour on the distal end of a post that accommodates the non-planar contact surface of the micro-transfer printable light-emitting diode device of FIG. 5 according to an embodiment of the present invention.
Figure 7:
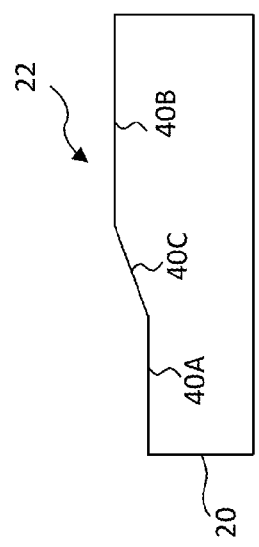
FIG. 7 is a cross section of the non-planar contact surface of the micro-transfer printable light-emitting diode device of FIG. 5 according to an embodiment of the present invention.

Referring to FIGS. 5, 6, and 7, in another embodiment of the present invention, a micro-transfer printable device 20 is a light-emitting diode (LED) having first and second planar portions 40A and 40B that are on different planes. FIG. 5 is a perspective of the micro-transfer printable device 20 and FIG. 7 is a cross section taken along the cross section line C of FIG. 5. FIG. 6 is a cross section of a stamp post 14 that illustrates first and second planar portions 30A and 30B corresponding to the first and second planar portions 40A and 40B of the micro-transfer printable device 20. When micro-transfer printing the micro-transfer printable device 20 with the stamp 10 having a post 14 with the non-planar surface contour 15, the first portion 30A of the surface of the distal end 16 of the post 14 is brought into contact with the first portion 40A of the micro-transfer printable device 20 and the second portion 30B of the surface of the distal end 16 of the post 14 is brought into contact with the second portion 40B of the micro-transfer printable device 20.

According to embodiments of the present invention, the aggregate (total) area of the first and second portions 30A and 30B together is larger than the contact area of a stamp with a planar post surface that would be in contact with the non-planar contact surface 22 of the micro-transferable printable device 20, for example only the area of the second portion 40B of the non-planar contact surface 22. Additionally, in certain embodiments, portion 40C of the post contacts portion 30C of the device 20. In alternative embodiments, portion 40C of the post does not contact portion 30C of the device 20.

The accommodating surface contour 15 of the surface of the distal end 16 of the post 14 can closely match the non-contact surface 22 of the micro-transfer printable device 20, for example as shown in FIGS. 2-4. Alternatively, the accommodating surface contour 15 can have similar, inverted structures that inversely match or correspond to structures on the non-contact surface 22. The structures on the surface contour 15 can be larger or smaller than the corresponding structure of the non-contact surface 22. Protrusions from the non-contact surface 22 can have matching recesses, cavities, or indentations in the accommodating surface contour 15 that have a similar or matching shape or that have a different shape. The matching recesses, cavities, or indentations can be larger than the protrusions.

Referring next to the cross section of FIG. 8, a stamp 10 having a body 12 has a post 14 with a non-planar surface contour 15 on the distal end 16 of the post 14 that has a size, shape, or size and shape that accommodates a non-planar contact surface 22 of a micro-transfer printable device 20 (FIG. 9). As shown in the cross section of FIG. 9, the non-planar contact surface 22 of the micro-transfer printable device 20 includes a protrusion 24 such as a spike or a ridge in the non-planar contact surface 22 extending from first and second planar portions 40A, 40B. The top of the spike or ridge has a third planar portion 40C and fourth planar portion 40D forming a side of the spike or ridge. If the protrusion 24 is a spike surrounded by a single planar portion, then the first and second planar portions 40A, 40B of the non-planar contact surface 22 (and the first and second planar portions 30A, 30B of the non-planar contour surface 15) can be the same planar portion. Alternatively, the protrusion 24 can be a ridge segmenting the first and second planar portions 40A, 40B (and the first and second planar portions 30A, 30B of the non-planar contour surface 15) into two non-contiguous planar portions in the same plane.

The stamp 10 of FIG. 8, includes a recess 17 or cavity forming an indentation in the first and second planar portions 30A, 30B. (If the protrusion 24 of the micro-transfer printable device 20 is a ridge, the first and second planar portions 30A, 30B are non-contiguous planar portions in the same plane. If the protrusion 24 of the micro-transfer printable device 20 is a spike, the first and second planar portions 30A, 30B the same planar portion.) The recess 17 of the non-planar surface of the distal end 16 of the post 14 corresponds to the protrusion 24 of the micro-transfer printable device 20 having a non-planar contact surface 22 and has a size, shape, or size and shape that accommodates the non-planar contact surface 22 of the micro-transfer printable device 20. For example, when the stamp 10 of FIG. 8 is pressed against the micro-transfer printable device 20, the protrusion 24 of the non-planar contact surface 22 extends into the recess 17 of the non-planar surface contour 15 so that the first and second portions 30A, 30B of the non-planar surface 15 contour on the distal end 16 of the post 14 can contact the first and second portions 40A, 40B of the non-planar contact surface 22 of the micro-transfer printable device 20. In contrast, if a conventional stamp with a planar post surface was used, only the area of the third planar portion 40C would be in contact with the stamp post 14. Since the area of the first and second planar portions 40A, 40B is much larger than the area of the third planar portion 40C, the stamp post 14 has improved adhesion to the non-planar contact surface 22 of the micro-transfer printable device 20.

In an embodiment of the present invention, the recess 17 or cavity in the non-planar surface of the distal end 16 of the post 14 has a size and shape that substantially matches the size and shape of the protrusion 24 of the non-planar contact surface 22 so that the protrusion 24 fits closely into the recess 17. Such an embodiment can increase the contact area between the non-planar surface of the distal end 16 of the post 14 and the non-planar contact surface 22 of the micro-transfer printable device 20. However, the mechanical control necessary to locate the stamp 10 in such close alignment with the micro-transfer printable device 20 that the protrusion 24 enters the recess 17 during micro transfer printing can be difficult or expensive to accomplish. Therefore, in an alternative embodiment of the present invention, the recess 17 or cavity in the non-planar surface of the distal end 16 of the post 14 is larger than the protruding portion 24 of the micro-transfer printable device 20. In the embodiment illustrated, the recess 17 or cavity has a substantially geometrically similar shape to the protrusion 24 but in a larger size. In this case, not all, or even none, of the protrusion 24 is in close contact with the non-planar surface of the distal end 16 of the post 14 and the contact area of the first and second portions 40A, 40B of the non-planar contact surface 22 of the micro-transfer printable device 20 corresponding to the first and second planar portions 30A, 30B of the non-planar surface of the distal end 16 of the post 14 is reduced. However, the aggregate contact area between the non-planar surface of the distal end 16 of the post 14 and the non-planar contact surface 22 of the micro-transfer printable device 20 is still much greater than area of the third planar portion 40C, so that the present invention still provides improved adhesion between the non-planar surface of the distal end 16 of the post 14 and the non-planar contact surface 22 of the micro-transfer printable device 20 than would be provided by a planar post surface and also alleviates mechanical registration and alignment concerns.

Figure 10:
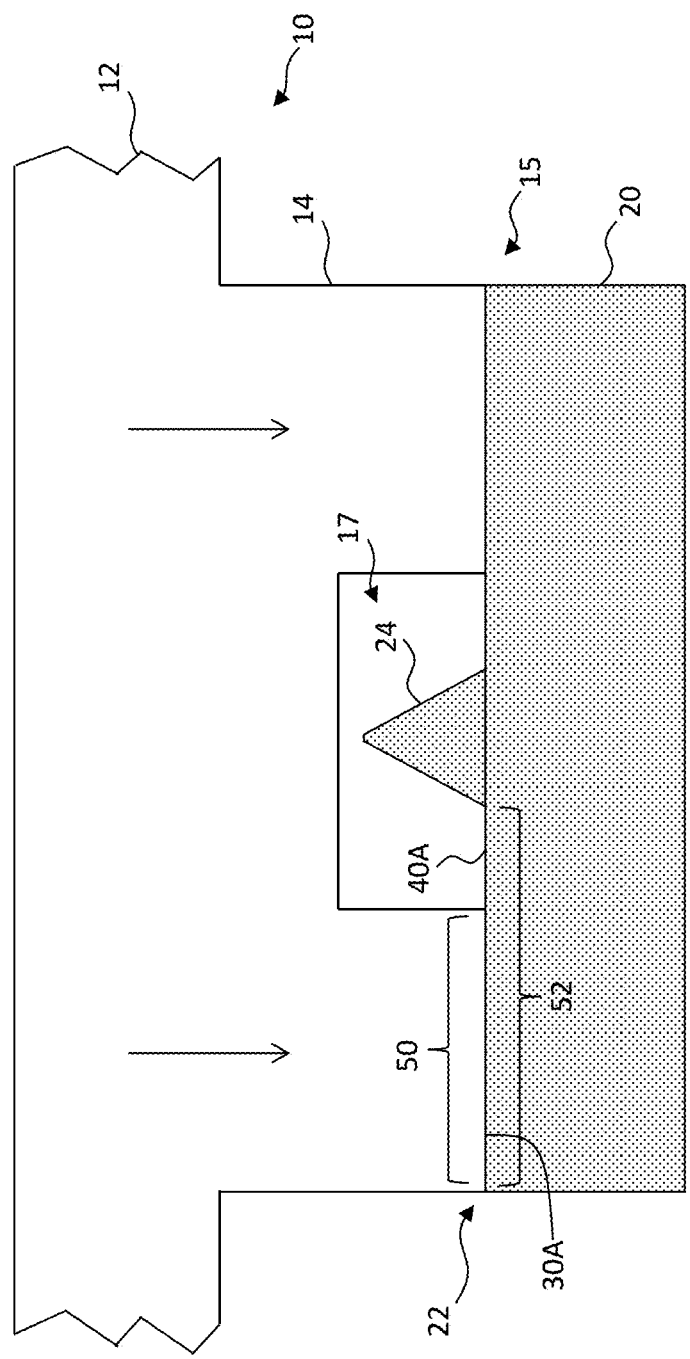
FIG. 10 is a cross section illustrating the surface contour on the distal end of a post and the corresponding accommodated non-planar contact surface of a micro-transfer printable device of FIG. 9 according to another embodiment of the present invention.

Referring to FIG. 10, the recess 17 or cavity forms a structure in the non-planar surface of the distal end 16 of the post 14 that has a shape that is different from and larger than the protrusion 24 of the non-planar contact surface 22 of the micro-transfer printable device 20. This structure can be easier to construct, reducing stamp manufacturing costs, and still provides increased contact area between the stamp 10 and the micro-transfer printable device 20. As indicated by the arrows in FIG. 10, the distal end 16 of the post 14 of the stamp 10 is brought into contact with the non-planar contact surface 22 of the micro-transfer printable device 20 with the protrusion 24 located within the recess 17 or cavity. Because the recess 17 is larger than the protrusion 24, the post area 50 of the first planar portion 30A that is in contact with the non-planar contact surface 22 of the micro-transfer printable device 20 is smaller than the printable device area 52 of the first planar portion 40A but still provides improved adhesion between the non-planar contact surface 22 of the micro-transfer printable device 20 and the non-planar surface on the distal end 16 of the post 14 of the stamp 10.

Figure 11:
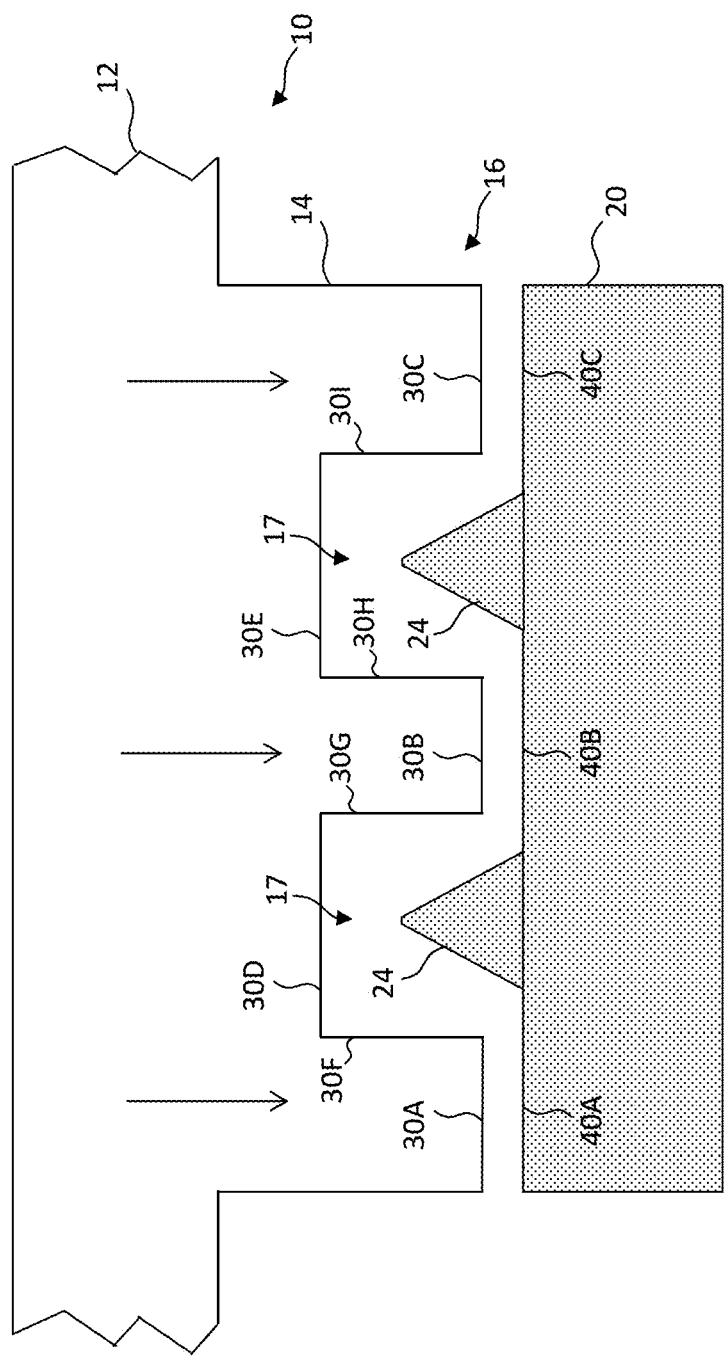
FIG. 11 is a cross section illustrating the surface contour on the distal end of a post and the corresponding accommodated non-planar contact surface of a micro-transfer printable device having two protrusions according to another embodiment of the present invention.

As shown in FIG. 11, a micro-transfer printable device 20 can have a non-planar contact surface 22 with multiple protrusions 24 that each correspond to one of a plurality of recesses 17, cavities, or indentations in the non-planar surface of the distal end 16 of the post 14. A single post 14 contacts a single micro-transfer printable device 20 and a single micro-transfer printable device 20 is contacted by a single post 14. However, as shown in various embodiments of the present invention, the non-planar surface of each post 14 can have multiple different portions, either contiguous or non-contiguous that contact corresponding multiple different portions of the non-planar contact surface 22 of the micro-transfer printable device 20 or that provide space for the protrusions 24. For example, according to embodiments of the present invention, the multiple first, second, and third planar portions 30A, 30B, 30C do not constitute individual and different posts 14 but each contact the corresponding first, second and third planar portions 40A, 40B, 40C of the non-planar contact surface respectively. The recesses 17 in the distal end 16 of the post 14 accommodating the protrusions 24 have fourth through ninth planar portions 30D-30I. The recesses 17 have a depth that is less than the length of the posts 14. The surface contour of the distal end 16 of the post 14 therefore includes all of the first through ninth planar portions 30A-30I.

In a further embodiment of the present invention, different posts 14 of the one or more posts 14 have different non-planar surface contours 15, for example to accommodate different non-planar contact surfaces 22 of different micro-transfer printable devices 20. In such a case, the one or more posts 14 include a first post 14 having a first non-planar surface contour 15 at the distal end 16 of the first post 14 and a second post 14 having a second non-planar surface contour 15 at the distal end 16 of the second post 14 different from the first non-planar surface contour 15. Thus, the present invention can enable micro-transfer printing different micro-transfer printable devices 20 at the same time in a single micro-transfer print step.

In another embodiment of the present invention, the surface contour 15 is at least partly curved, for example in a direction away from or toward the stamp body 12.

Figure 12:
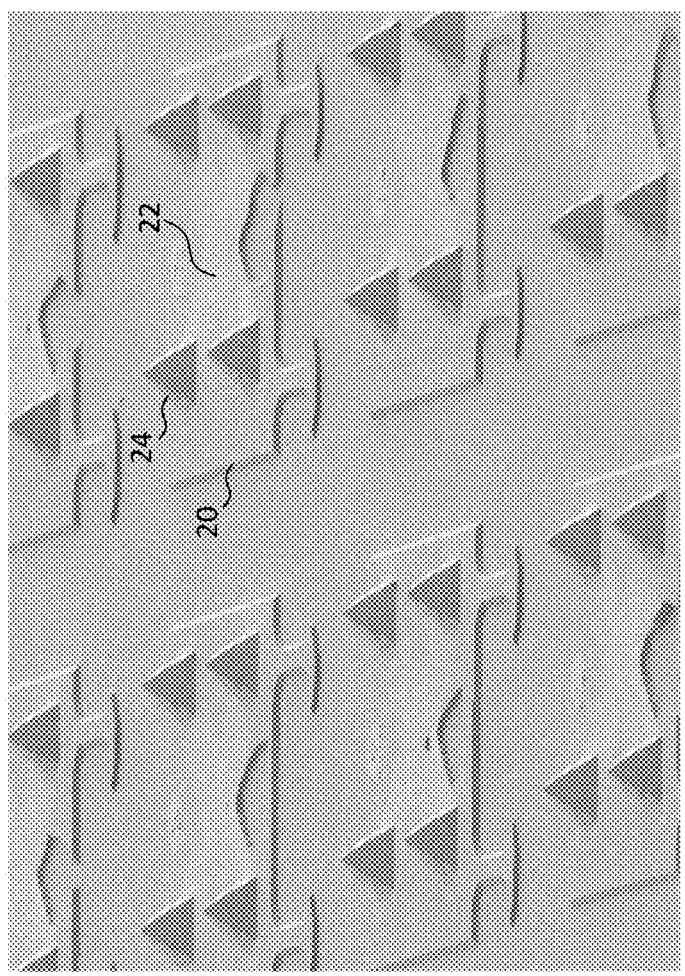
FIG. 12 is a micro-graph of a micro-transfer printable device having multiple protrusions according to an embodiment of the present invention.

FIG. 12 illustrates a plurality of identical micro-transfer printable devices 20 formed on a wafer. Each of the micro-transfer printable devices 20 has a non-planar contact surface 22 with four pyramidal protrusions 24.

Figure 13:
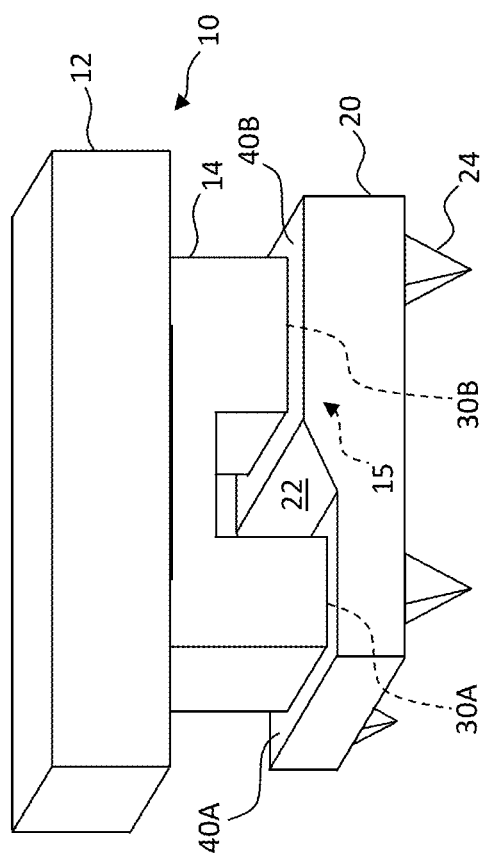
FIG. 13 is a perspective illustrating the distribution of pressure from a stamp on a micro-transfer printable device having multiple bottom-side protrusions according to an embodiment of the present invention.

FIGS. 9-12 illustrate micro-transfer printable devices 20 with protrusions 24 on the non-planar contact surface 22 of the micro-transfer printable devices 20. In an alternative embodiment of the present invention, protrusions 24 are located on a side of the micro-transfer printable device 20 opposite the non-planar contact surface 22, as shown in FIG. 13. Such protrusions 24 can enable electrical connections between a micro-transfer printable device 20 and a substrate contact pad, for example as described in U.S. Pat. No. 8,889,485, entitled Methods for Surface Attachment of Flipped Active Components whose contents are incorporated by reference. The protrusions 24 are forced into or through the substrate contact pad by pressure applied to the micro-transfer printable devices 20.

FIG. 13 illustrates a micro-transfer printable devices 20 as shown in FIG. 5 with a non-planar contact surface 22 and four pyramidal protrusions 24 on a side of the micro-transfer printable device 20 opposite the non-planar contact surface 22. As shown, the stamp 10 includes a post 14 with a non-planar surface contour 15 on the distal end of the post having a size, shape, or size and shape that accommodates the non-planar contact surface 22 of the micro-transfer printable device 20. The non-planar contact surface 22 includes first and second planar portions 40A and 40B that are in separate, parallel planes. (The dashed lead lines on FIG. 13 indicate that the surface contour and first and second planes 30A, 30B are hidden in the figure.) First planar portion 30A of the post 14 contacts the first planar portion 40A of the non-planar contact surface 22 and second planar portion 30B of the post 14 contacts the second planar portion 40B of the non-planar contact surface 22. Because the post 14 contacts only the first and second portions 40A and 40B of the non-planar contact surface 22, the contact pressure on the micro-transfer printable device 20 is non-uniform and, in this illustration, is substantially located over the protrusions 24, thus improving the formation of electrical contact between the protrusions 24 and a destination substrate contact pad (not shown) and reducing stress on the micro-transfer printable device 20, for example mitigating cracking, during micro transfer printing.

Experiments have demonstrated that a wide variety of thin micro-transfer printable devices 20, particularly those with a large aspect ratio (length to width), can bend during micro-transfer printing (forming a bow in the micro-transfer printable device 20). This bending or bow is visible under SEM examination and can cause cracks to propagate through the thin micro-transfer printable devices 20. Micro-transfer printable devices 20 with non-planar surfaces (e.g., the contact surface 23 or a surface on a side of the micro-transfer printable devices 20 opposite the contact surface) are especially susceptible to cracking because pressure applied to the non-planar surfaces tends to concentrate in the thinner portions of the micro-transfer printable devices 20, exacerbating the cracking problem. Micro-transfer printing stamps 10 having non-planar surface contours according to embodiments of the present invention can ameliorate this problem by applying pressure more evenly across a non-planar contact surface or by applying pressure more directly to thicker portions of the micro-transfer printable devices 20. Thus, certain embodiments of the present invention provide more reliable micro-transfer printing with reduced cracking of micro-transfer printable devices 20.

FIGS. 18A through 18H illustrate examples of micro-transfer printable devices 20 having non-planar contact surfaces 22. As discussed above, the non-planar contact surface 22 can include various contours, deformations, and shapes. FIGS. 18A though 18H illustrate example contact surfaces 22 on a micro-transfer printable device 20. As well as having a protrusion 24 (FIG. 10), a non-planar contact surface 22 can have a recess 26 (FIG. 18E) and a post surface contour 15 can have a corresponding protrusion (not shown). A recess 26 can be, for example, an optical or electrical via. In certain embodiments, the non-planar contact surfaces 22 of different devices 20 on a single wafer can vary and the corresponding surface contours 15 of the distal end 16 of the stamp posts 14 can vary accordingly so that a single stamp 10 can reliably pick up a variety of different micro-transfer printable devices 20 having a variety of non-planar contact surfaces 22 in a single micro transfer printing step. As explained herein, it is important to have a stamp that can pick up as many (e.g., all) of the devices on the wafer at a time to improve efficiency.

In various embodiments of the present invention, an aspect ratio (height-to-width) of each post 14 is from 1:4 to 4:1. In other embodiments, the aspect ratio of the post 14 is less than 1:4 or greater than 4:1. The non-planar contact surface 22 of each micro-transfer printable device 20 can be a three-dimensional surface, can include one or more recesses 26 or protrusions 24, or comprise a structured surface with a minimum height variation across the surface of at least 10 nm, 500 nm, 1 µm, or 2 µm, or 5 µm or a maximum height variation of 10 µm or 20 µm. In other embodiment, the structured surface has a height variation less than 10 nm or a maximum height variation greater than 20 µm. In other embodiments, the non-planar contact surface 22 of each micro-transfer printable device 20 comprises a structured surface with minimum height variation across the surface of at least 5 percent and a maximum height variation of 50% or less of the post height.

Figure 14:
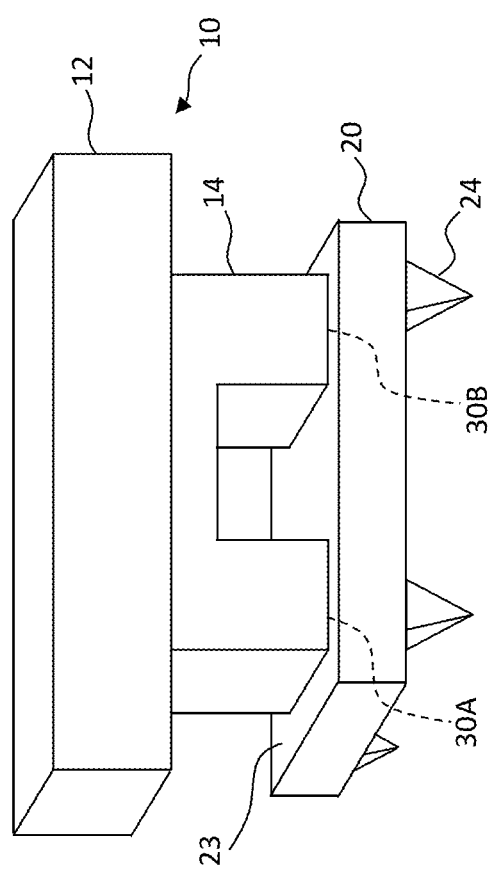
FIG. 14 is a perspective illustrating the distribution of pressure from a stamp on a micro-transfer printable device a flat contact surface and multiple bottom-side protrusions according to an embodiment of the present invention.
Figure 15:
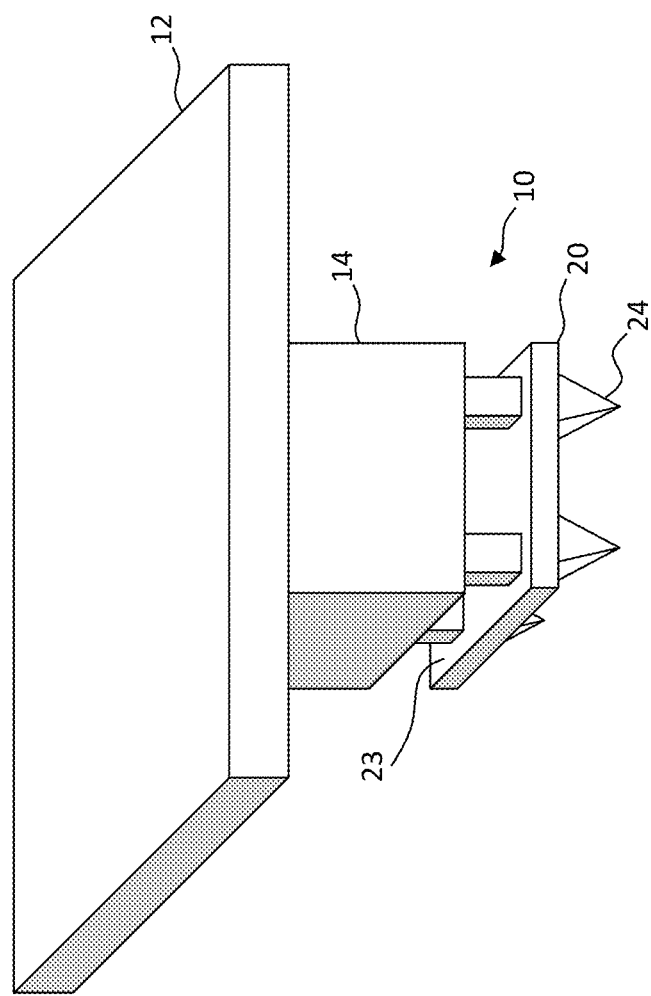
FIG. 15 is another perspective illustrating the distribution of pressure from a stamp on a micro-transfer printable device having a flat contact surface and multiple bottom-side protrusions according to an embodiment of the present invention.
Figure 16:
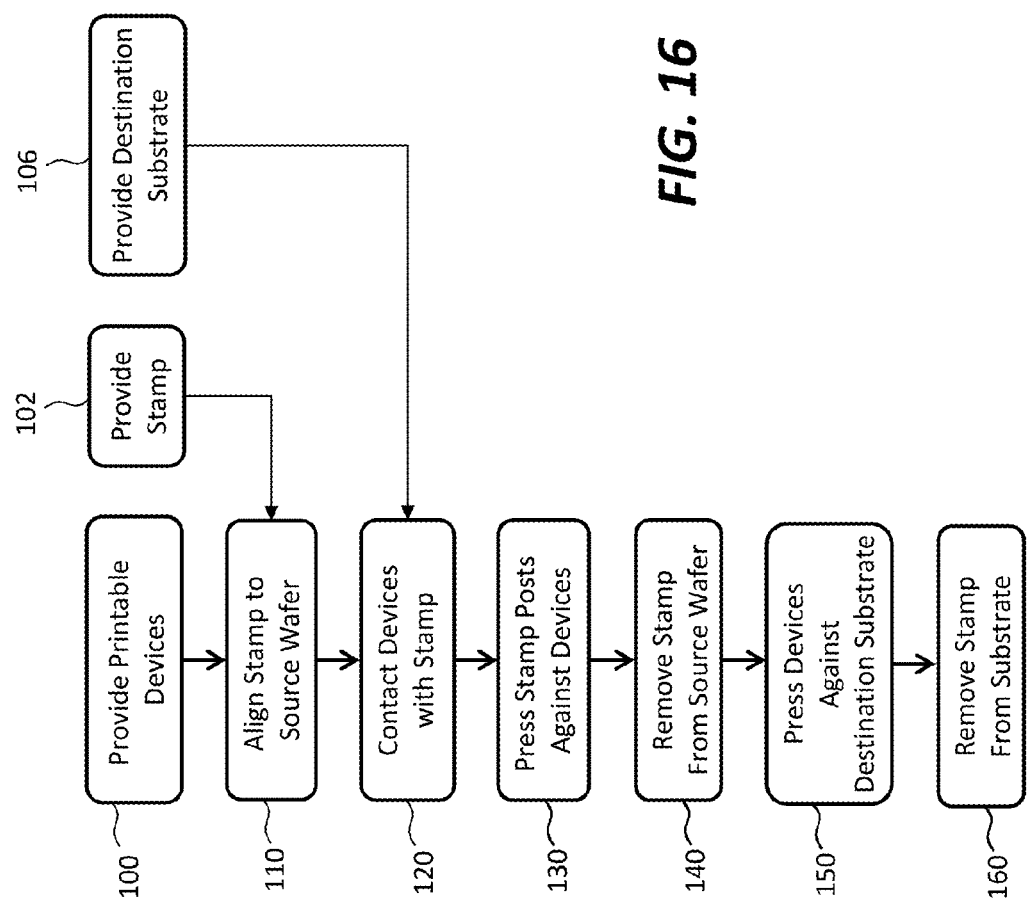
FIGS. 16-17 are flow charts illustrating methods in accordance with embodiments of the present invention.

Referring to FIG. 14, in another embodiment of the present invention, the contact surface 23 of the micro-transfer printable device 20 is planar and the micro-transfer printable device 20 includes one or more protrusions 24 on a side of the micro-transfer printable device 20 opposite the planar contact surface 23. The post 14 of the stamp 10 contacts only a portion of the contact surface 23. The contacted portion is at least partly, significantly, substantially, or exclusively opposite the protrusions 24, increasing the pressure over the protrusions 24. This increase in contact pressure over the protrusions 24 can increase the yields for forming electrical contacts between the micro-transfer printable device 20 and a destination substrate contact pad and reducing damage, such as cracking, on the micro-transfer printable device 20. As shown in FIG. 14, the post 14 of the stamp 10 includes two planar portions 30A, 30B; each of the planar portions 30A, 30B corresponds to two protrusions 24 on the opposite side of the micro-transfer printable device 20 from the contact surface 23. In an alternative embodiment, referring to FIG. 15, the post 14 of the stamp 10 includes a separate planar portion for each protrusion 24 on the micro-transfer printable device 20, thus distributing the contact pressure even further and concentrating it over each of the protrusions 24. In both the cases illustrated in FIGS. 14 and 15, micro-transfer printable device 20 has a non-planar surface on a side of the micro-transfer printable device 20 opposite the contact surface 23. The non-planar surface contour 15 accommodates the non-planar surface of the micro-transfer printable device 20 by distributing the pressure of the stamp post 14 in areas of the contact surface 23 opposite the non-planar portions (i.e., the protrusions 24). Referring to FIG. 16, a method of using the stamp 10 includes providing a stamp 10 in step 102, providing a destination substrate in step 106, and providing a micro-transfer printable device 20 in or on a source substrate (e.g., a source wafer) in step 100. The micro-transfer printable device 20 has a non-planar contact surface 22. The stamp 10 is aligned with the source wafer in step 110 and the micro-transfer printable devices 20 are contacted with the stamp posts 14 in step 120. The non-planar surfaces at the distal end 16 of one of the one or more posts 14 are pressed against the non-planar contact surfaces 22 of the micro-transfer printable devices 20 to adhere the micro-transfer printable devices 20 to the distal end 16 of the posts 14 in step 130. The stamp 10 is removed from the wafer in step 140 to micro-transfer the printable devices 20 from the wafer with the stamp 10. In step 150, the micro-transfer printable devices 20 are pressed against a destination substrate with the stamp 10 to adhere the micro-transfer printable devices 20 to the destination substrate. The stamp 10 is removed from the micro-transfer printable devices 20 and the destination substrate in step 160.

According to a further embodiment of the present invention, the stamp 10 is misaligned with the micro-transfer printable devices 20 on the source substrate when the stamp 10 is contacted to the source substrate in step 110 so that a post 14 of the stamp 10 is physically displaced when mechanically placed in contact with the non-planar contact surface 22 of the micro-transfer printable device 20 on the source substrate by structures (such as protrusions 24) on the non-planar contact surface 22. When the stamp 10 is removed from the source wafer to release the micro-transfer printable device 20, the post 14 relaxes from its displaced state and moves the micro-transfer printable device 20 with respect to the stamp body 12 (but not the post 14). The micro-transfer printable device 20 is then properly aligned with the destination substrate 30 when the micro-transfer printable device 20 is pressed against the destination substrate in step 150. Thus, the non-planar surface contour 15 on the distal end 16 of the post 14 of the stamp 10 serves to improve printing registration when used for micro transfer printing. Essentially, the structures on the non-planar contact surface 22 of the micro-transfer printable devices 20 act as mechanical stops to the non-planar surface contour 15 on the distal end 16 of the post 14 of the stamp 10 to properly align the micro-transfer printable device 20 with the post 14.

Figure 17:
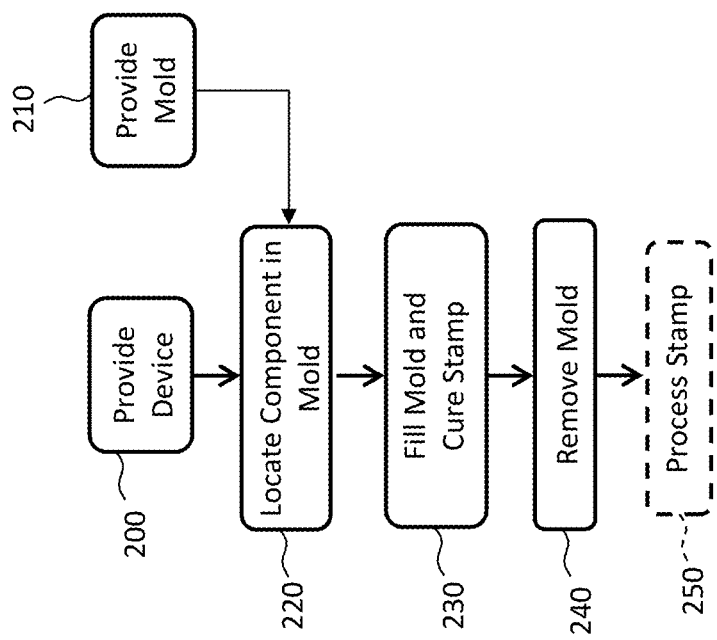

Referring to FIG. 17, a method of making a stamp 10 for micro-transfer printing includes providing a mold having a body portion and one or more post portions that extend away from the body portion in step 210 and providing a device having a non-planar contact surface 22 in step 200. The device can be a functional micro-transfer printable device 20 or a dummy device; for example having a surface similar to the non-planar contact surface 22 of the micro-transfer printable device 20. In step 220, the non-planar contact surface 22 of the device is located at the distal end 16 of the post portion and the mold is filled with curable stamp material, for example PDMS, and cured in step 230. The mold is removed in step 240 to form a stamp 10 for micro-transfer printing having a non-planar surface at the distal ends 16 of one or more posts 14. In a further, optional step 250, the non-planar surfaces of the distal ends 16 of the posts 14 are processed; for example by exposure to a reactive or abrasive material to remove a portion of the non-planar surface of the distal ends 16 of the posts 14. This exposure can remove material from the non-planar surface to change the size or shape of the non-planar surface contour 15 at the distal end 16 of the post 14; for example to enlarge or reduce the size of structures on the non-planar surface, as shown in the recess 17 of FIG. 8. A process step 250 can be an etching process and the reactive material can be an etchant. Alternatively, a process step 250 can be a sand-blasting step and an abrasive material can be a sand-blasting material such as sand or other abrasive particles. The surface of the distal end 16 of the post 14 can be a rough surface.

The micro-transfer printable device 20 can be an active component, for example including one or more active elements such as electronic transistors or diodes, light-emitting diodes, or photodiodes that produce an electrical current in response to ambient light. Alternatively, the micro-transfer printable device 20 can be a passive component, for example including one or more passive elements such as resistors, capacitors, or conductors. In another embodiment, the micro-transfer printable device 20 is a compound micro-transfer printable device 20 that includes both active and passive elements. The micro-transfer printable device 20 can be a semiconductor device having one or more semiconductor layers, such as an integrated circuit or chiplet. The micro-transfer printable device 20 can be an unpackaged die. In yet another embodiment, the micro-transfer printable device 20 is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. The compound element can be micro-transfer printed itself after the elements have been arranged and interconnected thereon. The micro-transfer printable device 20 can be electronic processors, controllers, drivers, light-emitting diodes, photodiodes, light-control devices, or light-management devices.

The micro-transfer printable devices 20 can include active elements such as electronic circuits formed using lithographic processes and can include passive elements such as electrical connections, e.g., wires. In some embodiments of the present invention, the micro-transfer printable devices 20 are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet printable component structures 10 can be made in a source semiconductor wafer (e.g., a silicon or GaN wafer) having a process side and a back side used to handle and transport the wafer. Micro-transfer printable devices 20 are formed using lithographic processes in an active layer on or in the process side of the source wafer. An empty release layer space is formed beneath the micro-transfer printable devices 20 with tethers connecting the micro-transfer printable devices 20 to the source wafer in such a way that pressure applied against the micro-transfer printable devices 20 breaks the tethers to release the micro-transfer printable devices 20 from the source wafer (e.g., with the stamp 10). Methods of forming such structures are described, for example, in the paper AMOLED Displays using Transfer-Printed Integrated Circuits and U.S. Pat. No. 8,889,485. Lithographic processes for forming micro-transfer printable devices 20 in a source wafer, for example transistors, wires, and capacitors, are found in the integrated circuit art.

According to various embodiments of the present invention, the native source wafer can be provided with the micro-transfer printable device 20, release layer, and tethers already formed, or they can be constructed as part of the process of the present invention.

Micro-transfer printable devices 20 can be small electronic integrated circuits, for example, having a size of about 5 microns to about 5000 microns in a dimension. The electronic circuits can include semiconductor materials (for example inorganic materials such as silicon or gallium arsenide, or inorganic materials) having various structures, including crystalline, microcrystalline, polycrystalline, or amorphous structures. In another embodiment, the micro-transfer printable devices 20 are passive, for example including a conductor that, when used in a printed structure serves to electrically connect one conductor (e.g., a backplane electrical contact) to another, forming a jumper. The micro-transfer printable devices 20 can also include insulating layers and structures such as silicon dioxide, nitride, and passivation layers and conductive layers or structures including wires made of aluminum, titanium, silver, or gold that foam an electronic circuit. Methods and materials for making micro-transfer printable device 20 electronic circuits are used in the integrated circuit arts. Large numbers of such small integrated circuits are formed on a single source wafer. The micro-transfer printable device 20 are typically packed as closely as possible to use the surface area of the source wafer as efficiently as possible.

In some embodiments, the micro-transfer printable devices 20 are small integrated circuits formed in a semiconductor wafer, for example gallium arsenide or silicon, which can have a crystalline structure. Processing technologies for these materials typically employ high heat and reactive chemicals. However, by employing transfer technologies that do not stress the micro-transfer printable devices 20 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the destination substrates. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the micro-transfer printable devices 20 can be formed in a microcrystalline, polycrystalline, or amorphous semiconductor layer.

The micro-transfer printable devices 20 can be constructed using foundry fabrication processes used in the art. Layers of materials can be used, including materials such as metals, oxides, nitrides and other materials used in the integrated-circuit art. Each micro-transfer printable device 20 can be a complete semiconductor integrated circuit and can include, for example, transistors. The micro-transfer printable device 20 can have different sizes, for example, 1000 square microns or 10,000 square microns, 100,000 square microns, or 1 square mm, or larger, and can have variable aspect ratios, for example 1:1, 2:1, 5:1, or 10:1. The printable component structures 10 can be rectangular or can have other shapes.

The source wafer and micro-transfer printable devices 20, stamp 10, and destination substrate can be made separately and at different times or in different temporal orders or locations and provided in various process states.

The method of the present invention can be iteratively applied to a single or multiple destination substrates. By repeatedly transferring sub-arrays of micro-transfer printable devices 20 from a source wafer to a destination substrate with a stamp 10 and relatively moving the stamp 10 and destination substrate between stamping operations by a distance equal to the spacing of the selected micro-transfer printable devices 20 in the transferred sub-array between each transfer of micro-transfer printable devices 20, an array of micro-transfer printable devices 20 formed at a high density on a source wafer can be transferred to a destination substrate at a much lower density. In practice, the source wafer is likely to be expensive, and forming micro-transfer printable devices 20 with a high density on the source wafer will reduce the cost of the micro-transfer printable devices 20, especially as compared to forming components on the destination substrate. Transferring the micro-transfer printable devices 20 to a lower-density destination substrate can be used, for example, if the micro-transfer printable devices 20 manage elements distributed over the destination substrate, for example in a display, digital radiographic plate, or photovoltaic system.

In particular, in the case wherein the active micro-transfer printable device 20 is an integrated circuit formed in a crystalline semiconductor material, the integrated circuit substrate provides sufficient cohesion, strength, and flexibility that it can adhere to the destination substrate without breaking as the transfer stamp 10 is removed.

In comparison to thin-film manufacturing methods, using densely populated source substrates wafers and transferring micro-transfer printable devices 20 to a destination substrate that requires only a sparse array of micro-transfer printable devices 20 located thereon does not waste or require active layer material on a destination substrate. The present invention can also be used in transferring micro-transfer printable devices 20 made with crystalline semiconductor materials that have higher performance than thin-film active components. Furthermore, the flatness, smoothness, chemical stability, and heat stability requirements for a destination substrate used in embodiments of the present invention may be reduced because the adhesion and transfer process is not substantially limited by the material properties of the destination substrate. Manufacturing and material costs may be reduced because of high utilization rates of more expensive materials (e.g., the source substrate) and reduced material and processing requirements for the destination substrate.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line
B cross section line
C cross section line
10 stamp
12 body
14 post
15 post surface contour
16 distal end of post
17 recess
18 structure
20 micro-transfer printable device
22 non-planar contact surface
23 contact surface
24 protrusion
26 recess
30A first planar portion of surface contour 30B second planar portion of surface contour
30C third planar portion of surface contour
30D fourth planar portion of surface contour
30E fifth planar portion of surface contour
30F sixth planar portion of surface contour
30G seventh planar portion of surface contour
30H eighth planar portion of surface contour
30I ninth planar portion of surface contour
40A first planar portion of non-planar contact surface
40B second planar portion of non-planar contact surface
40C third planar portion of non-planar contact surface
40D fourth planar portion of non-planar contact surface
50 post area
52 printable device area
100 provide printable component structure step
102 provide stamp step
106 provide destination substrate step
110 align stamp to source wafer step
120 contact devices with stamp step
130 press stamp posts against devices step
140 remove stamp from source wafer step
150 press devices against destination substrate step
160 remove stamp from substrate step
200 provide device step
210 locate device in mold step
220 provide mold step
230 fill mold and cure stamp step
240 remove mold step
250 optional etch stamp step

What is claimed:

1. A system for micro-transfer printing, comprising:
an array of micro-transfer printable devices formed on or in a source substrate, each micro-transfer printable device having a non-planar contact surface limited to a single side of the micro-transfer printable device opposite the source substrate; and
a micro-transfer printing stamp for micro-transfer printing the micro-transfer printable devices from the source substrate to a destination substrate, the micro-transfer printing stamp comprising:
a body, and
an array of posts extending from the body, wherein each post in the array of posts has a non-planar surface contour on the distal end of the post having at least one of a size and shape that corresponds to the non-planar contact surface of the micro-transfer printable device while picking up and transferring the micro-transfer printable device to the destination substrate with the micro-transfer printing stamp, wherein the non-planar surface contour of each post is limited to the non-planar contact surface of the micro-transfer printable device.

2. The system of claim 1, wherein the non-planar contact surface of each micro-transfer printable device comprises a three-dimensional surface.

3. The system of claim 1, wherein the non-planar contact surface of each micro-transfer printable device comprises one or more recesses.

4. The system of claim 1, wherein the non-planar contact surface of each micro-transfer printable device comprises a structured surface with minimum height variation across the surface of at least 10 nm or a maximum height variation of 20 μm.

5. The system of claim 1, wherein the non-planar contact surface of each micro-transfer printable device comprises a structured surface with a minimum height variation across the surface of at least 5 percent of the post height or a maximum height variation across the surface of less than or equal to 50 percent of the post height.

6. The system of claim 1, wherein the non-planar surface contour at the distal end of each post has a plurality of non-contiguous planar portions that accommodate non-contiguous planar portions of the contact surface of a respective printable device.

7. The system of claim 6, wherein two or more of the plurality of non-contiguous planar portions of each post are parallel.

8. The system of claim 6, wherein two or more of the plurality of non-contiguous planar portions of each post are in the same plane.

9. The system of claim 6, wherein two or more of the plurality of non-contiguous planar portions of each post are non-parallel and non-orthogonal.

10. The system of claim 6, wherein the non-contiguous planar portions of each post have an area smaller than the corresponding non-contiguous planar portions of the contact surface of each printable device.

11. The system of claim 1, wherein the non-planar surface contour is at least partly curved.

12. The system of claim 1, wherein:
the non-planar surface of each post comprises a cavity;
the non-planar contact surface of each micro-transfer printable device comprises a protruding portion; and
each cavity corresponds to the protruding portion of a respective micro-transfer printable device having a non-planar contact surface during a transfer operation.

13. The system of claim 12, wherein each cavity is larger than the protruding portion of a respective micro-transfer printable device.

14. The system of claim 13, wherein each cavity has a different shape than the protruding portion of a respective micro-transfer printable device.

15. The system of claim 12, wherein each cavity has a shape that is substantially similar to the protruding portion of a respective micro-transfer printable device.

16. The system of claim 1, wherein the posts comprise a first post having a first non-planar surface contour at the distal end of the first post and a second post having a second non-planar surface contour at the distal end of the second post, wherein the second non-planar surface contour is different from the first non-planar surface contour.

17. A method of using a micro-transfer printing stamp, comprising:
providing an array of micro-transfer printable devices formed on or in a source substrate, each micro-transfer printable device having a non-planar contact surface limited to a single side of the micro-transfer printable device opposite the source substrate;
providing the micro-transfer printing stamp for micro-transfer printing the micro-transfer printable devices from the source substrate to a destination substrate, the micro-transfer printing stamp comprising:
a body, and
an array of posts extending from the body, wherein each post in the array of posts has a non-planar surface contour on the distal end of the post having at least one of a size and shape that corresponds to the non-planar contact surface of the micro-transfer printable device during micro-transfer printing, wherein the non-planar surface contour of each post is limited to the non-planar contact surface of the micro-transfer printable device;
pressing the non-planar surface at the distal end of one of the one or more posts against the non-planar contact surface of the micro-transfer printable devices to adhere each micro-transfer printable device to the distal end of a respective post;

removing the micro-transfer printable devices from the wafer with the micro-transfer printing stamp;

pressing the micro-transfer printable devices to a destination substrate with the micro-transfer printing stamp to adhere the micro-transfer printable devices to the destination substrate; and removing the micro-transfer printing stamp from the micro-transfer printable devices, thereby transferring the micro-transfer printable devices to the destination substrate.

18. The method of claim 17, comprising:

contacting the micro-transfer printing stamp to the source substrate, wherein each post of the micro-transfer printing stamp is displaced when placed in contact with a respective non-planar contact surface of the micro-transfer printable device on the source wafer; and removing the micro-transfer printing stamp from the source substrate to release the micro-transfer printable device from the source substrate.

19. A system for micro-transfer printing, comprising:

an array of micro-transfer printable devices formed on or in a source substrate, each micro-transfer printable device having a first side with a contact surface limited to the first side and a second side, opposite the first side, with one or more protrusions thereon; and a micro-transfer printing stamp for micro-transfer printing the micro-transfer printable devices from the source substrate to a destination substrate, the micro-transfer printing stamp comprising:

a body, an array of posts extending from the body, wherein each post in the array of posts has a non-planar surface contour on the distal end of the post such that discrete portions of the non-planar surface contour contact the contact surface of a respective micro-transfer printable device while picking up and transferring the micro-transfer printable device to the destination substrate with the micro-transfer printing stamp, wherein the non-planar surface contour of each post is limited to the contact surface of the first side of the micro-transfer printable device.

20. The system of claim 19, wherein the micro-transfer printing stamp provides non-uniform pressure over the contact surface.

* * * * *